(12) United States Patent
Takeda et al.

(10) Patent No.: US 11,750,320 B2
(45) Date of Patent: Sep. 5, 2023

(54) COMMUNICATION APPARATUS AND DECODING METHOD

(71) Applicant: NTT DOCOMO, INC., Tokyo (JP)

(72) Inventors: Kazuki Takeda, Tokyo (JP); Satoshi Nagata, Tokyo (JP); Runxin Wang, Beijing (CN); Chongning Na, Beijing (CN)

(73) Assignee: NTT DOCOMO, INC., Tokyo (JP)

( * ) Notice: Subject to any disclaimer, the term of this patent is extended or adjusted under 35 U.S.C. 154(b) by 0 days.

(21) Appl. No.: 16/766,530

(22) PCT Filed: Nov. 28, 2018

(86) PCT No.: PCT/JP2018/043870
§ 371 (c)(1),
(2) Date: May 22, 2020

(87) PCT Pub. No.: WO2019/107452
PCT Pub. Date: Jun. 6, 2019

(65) Prior Publication Data
US 2020/0351014 A1    Nov. 5, 2020

(30) Foreign Application Priority Data
Nov. 29, 2017    (JP) ................................ 2017-229496

(51) Int. Cl.
*H04L 1/00*    (2006.01)
*H04W 28/04*    (2009.01)

(52) U.S. Cl.
CPC .......... *H04L 1/0042* (2013.01); *H04L 1/0057* (2013.01); *H04W 28/04* (2013.01)

(58) Field of Classification Search
CPC ..... H04L 1/0042; H04L 1/0057; H04W 28/04
See application file for complete search history.

(56) References Cited

U.S. PATENT DOCUMENTS

| 2013/0117344 A1 | 5/2013 | Gross et al. |
| 2017/0155405 A1 | 6/2017 | Ge et al. |

(Continued)

FOREIGN PATENT DOCUMENTS

| WO | 2017092693 A1 | 6/2017 |
| WO | 2019095853 A1 | 5/2019 |

OTHER PUBLICATIONS

E Arikan et al. "Channel Polarization: A Method for Constructing Capacity-Achieving Codes for Symmetric Binary-Input Memoryless Channels" IEEE Transactions on Information Theory, vol. 55, No. 7, Jul. 2009 (23 pages).

(Continued)

*Primary Examiner* — David B Lugo
(74) *Attorney, Agent, or Firm* — Osha Bergman Watanabe & Burton LLP

(57) ABSTRACT

A communication apparatus is disclosed including a processor that performs a first encoding procedure to generate a first sequence of encoded bits from a first sequence of bits, and performs a second encoding procedure to generate a second sequence of encoded bits from a sequence of known bits; and a second sequence of bits comprising the first sequence of bits and the first sequence of encoded bits; and a transmitter that transmits a signal generated from the second sequence of encoded bits, wherein the second sequence of encoded bits is determined based on a length of the second sequence of bits.

5 Claims, 22 Drawing Sheets

(56) References Cited

U.S. PATENT DOCUMENTS

| | | | |
|---|---|---|---|
| 2017/0366199 A1* | 12/2017 | Ge | G06F 11/1004 |
| 2018/0331693 A1* | 11/2018 | Lou | H04L 1/0061 |
| 2019/0372591 A1* | 12/2019 | Chen | H04L 1/0052 |
| 2019/0393987 A1* | 12/2019 | Hong | H04L 1/0057 |
| 2020/0259588 A1* | 8/2020 | Iyer | H04L 5/0048 |
| 2020/0314779 A1* | 10/2020 | Xie | H04W 56/001 |
| 2020/0322086 A1* | 10/2020 | Xu | H04L 1/0057 |

OTHER PUBLICATIONS

N Miki et al. "Polar Codes for Mobile Communication Systems and Standardization Activity", IEICE technical report, vol. 116, No. 396, RCS2016-271, pp. 205-210, Jan. 2017 (56 pages).

3GPP TS 36.321 V14.1.0 "3rd Generation Partnership Project; Technical Specification Group Radio Access Network; Evolved Universal Terrestrial Radio Access (E-UTRA); Medium Access Control (MAC) protocol specification (Release 14)" Dec. 2016 (98 pages).

3GPP TSG RAN WG1 Meeting 91; R1-1720704 "DCI CRC Initialization and Masking" Qualcomm Incorporated; Reno, USA; Nov. 27-Dec. 1, 2017 (6 pages).

3GPP TSG RAN WG1 Meeting 90bis; R1-1717995 "Remaining Issues of Polar Code Construction for UCI and DCI" Ericsson; Prague, CZ; Oct. 9-13, 2017 (16 pages).

International Search Report issued in International Application No. PCT/JP2018/043870, dated Feb. 12, 2019 (5 pages).

Written Opinion issued in International Application No. PCT/JP2018/043870; dated Feb. 12, 2019 (6 pages).

Office Action issued in the counterpart Indian Patent Application No. 202037027059, dated May 31, 2021 (7 pages).

Extended European Search Report issued in counterpart Application No. 18883202.6 dated Jul. 13, 2021 (12 pages).

Office Action issued in Indonesian Application No. P00202004574; dated Feb. 10, 2023 (6 pages).

* cited by examiner

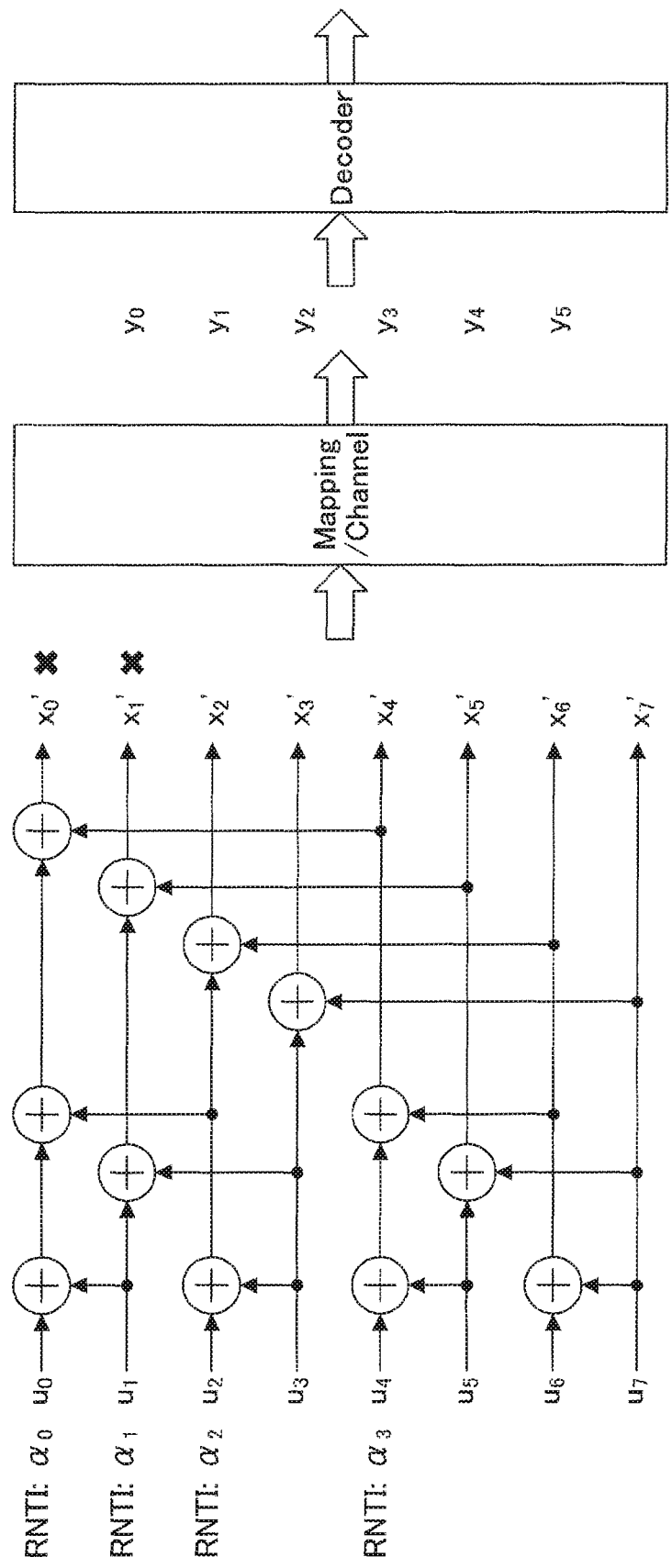

FIG.17

| CATEGORY | METHOD 1 | METHOD 2 | METHOD 3 |
|---|---|---|---|
| RNTI SCRAMBLING | SCRAMBLING ON CRC | SCRAMBLING ON FROZEN BITS | SCRAMBLING ON PADDING BITS |
| FAR | FAR DEPENDS ON LENGTH OF CRC. IN ORDER TO IMPROVE FAR, MORE CRC BITS ARE NEEDED, RESULTING IN OVERHEAD INCREASE. | IT IS POSSIBLE TO REDUCE FALSE DETECTION RATE WITHOUT INCREASING OVERHEAD. HOWEVER, CHARACTERISTICS MAY BE UNSTABLE OR NON-ROBUST. | IT IS POSSIBLE TO REDUCE FALSE DETECTION RATE DEPENDING ON LENGTH OF PADDING BITS. IT IS POSSIBLE TO REDUCE OVERHEAD BY USING SOME OF FROZEN BITS AS PADDING BITS. |
| RNTI USAGE | AFTER DECODING | BEFORE DECODING | BEFORE DECODING |

FIG.21
EXAMPLE WHERE Additional bits ARE NOT USED
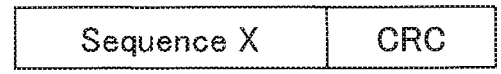
EXAMPLE WHERE Additional bits ARE USED
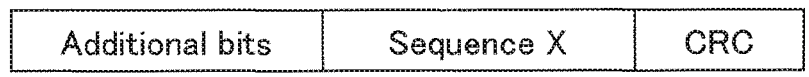
FIG.22
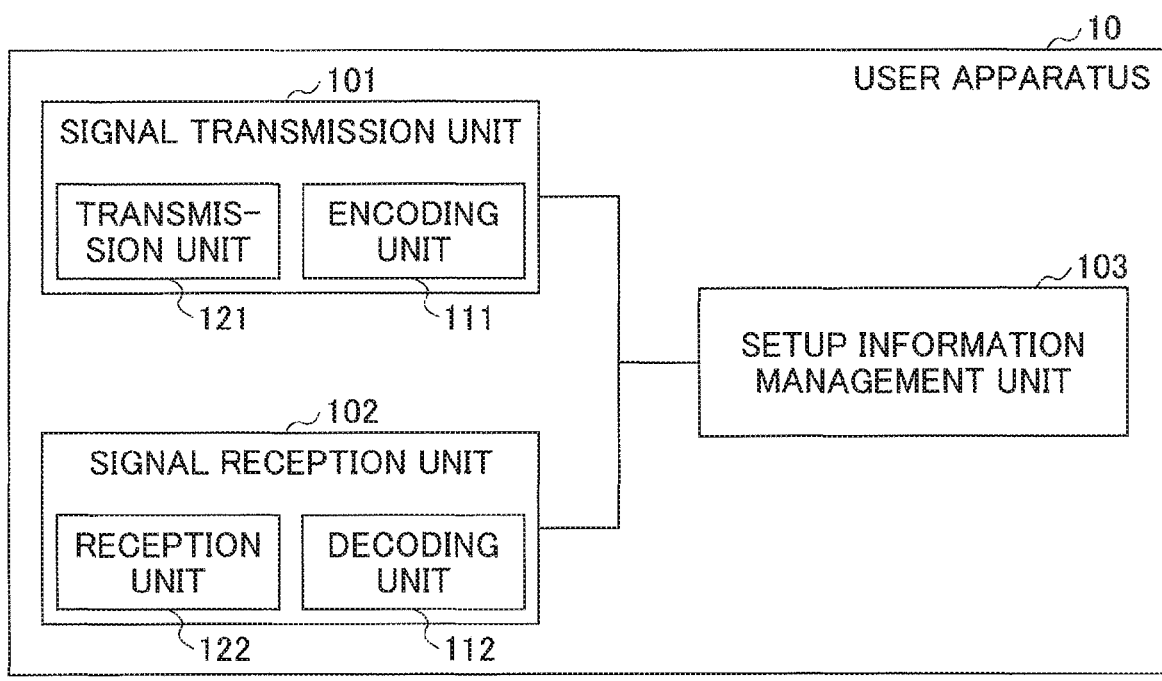

COMMUNICATION APPARATUS AND DECODING METHOD

TECHNICAL FIELD

The present invention relates to a communication apparatus used as a user apparatus or a base station in a radio communication system.

BACKGROUND ART

Concerning 3GPP (3rd Generation Partnership Project), a radio communication scheme called 5G has been studied for a further increase in the system capacity, a further increase in the data transmission rate, a further reduction in the delay in the radio section, and so forth. Concerning 5G, various radio technologies have been studied for satisfaction of a requirement for implementation of the throughput greater than or equal to 10 Gbps and the delay in the radio section less than or equal to 1 ms. Because there is a high possibility that a radio technology different from LTE will be adopted for 5G, a radio network that supports 5G will be referred to as a new network (NR: New Radio) in 3GPP and thus is distinguished from a radio network that supports LTE.

For 5G, mainly three use cases, i.e., eMBB (extended Mobile Broadband), MTC (massive Machine Type Communication), and URLLC (Ultra Reliability and Low Latency Communication) are assumed.

For example, for eMBB, a further increase in the rate and a further increase in the capacity are demanded, whereas, for mMTC, it is demanded to connect to a great number of terminals and reduce power consumption; and, for URLLC, it is demanded to improve reliability and reduce the delay. In order to satisfy these requirements, it is also required to satisfy requirements also concerning channel encoding indispensable for mobile communication.

A candidate for satisfying the requirements is Polar codes (Non-patent document 1). Polar codes are error correcting codes with which it is possible to implement characteristics near the Shannon limit, on the basis of the idea of channel polarization. Furthermore, by using a simple Successive Cancelation Decoding (SCD) method as a Polar code decoding method, it is possible to implement superior characteristics of requiring a low operation amount and low power consumption. As decoding methods for Polar codes, a Successive Cancellation List Decoding (SCLD) method improving characteristics of SCD and a CRC-aided SCLD method using a CRC (Cyclic Redundancy Check) further improving the characteristics are known (Non-patent document 2). According to a CRC-aided SCLD method, a plurality of sequences (bit sequences) having high likelihoods are obtained, and thereamong, a single sequence that is successful in CRC judgement is selected as a final decoding result.

PRIOR ART DOCUMENTS

Non-Patent Documents

Non-patent Document 1: E. Arikan, "Channel Polarization: A Method for Constructing Capacity-Achieving Codes for Symmetric Binary-Input Memoryless Channels", IEEE Trans. Inf. Theory, vol. 55, no. 7, pp. 3051-3073, July 2009.
Non-patent Document 2: Nobuhiko Miki and Satoshi Nagata, "Application of Polar Codes to Mobile Communication Systems and 5G Standardization Activity", IEICE technical report, vol. 116, no. 396, RCS2016-271, pp. 205-210, January 2017.
Non-patent Document 3: 3GPP TS 36.321 V14.1.0 (2016-12)

SUMMARY OF THE INVENTION

Problem to be Solved by the Invention

According to NR, it is assumed to use Polar codes for a downlink control channel.

According to existing LTE, a base station attaches a CRC (hereinafter, a value to be used for CRC is referred to by a "CRC") to downlink control information, encodes CRC information obtained from masking using a RNTI (Radio Network Temporary Identifier), and transmits the information to a user apparatus. The user apparatus having received the information performs, in a decoding process for the received information, judgement using the CRC obtained from unmasking the information using the RNTI that the user apparatus itself has, to determine whether the information is addressed to the user apparatus itself.

However, for a case of using Polar codes that have not been used in existing LTE, it is not apparent how to use a RNTI. Depending on a method to apply a RNTI, there is a high possibility of a user apparatus erroneously determining that control information addressed to the user apparatus itself is not proper information (that is, a CRC check failure) or of erroneously determining that control information not addressed to the user apparatus itself is control information addressed to the user apparatus itself. Such a possibility is called a false alarm rate, which may be referred to as a false detection rate.

In addition, for a case of, for example, performing Polar encoding on payloads of downlink control information or the like, there is a case where, although payload sizes are different, bit lengths for encoding are the same. Therefore, it is not easy for a Polar decoder to identify a payload size.

Note that it is assumed that Polar codes and identifiers such as RNTIs will be used for, not only downlink communication from a base station to a user apparatus but also uplink communication from a user apparatus to a base station and sidelink communication between user apparatuses. Therefore, problems such as those mentioned above also occur in, not only downlink communication from a base station to a user apparatus but also uplink communication from a user apparatus to a base station and sidelink communication between user apparatuses. Apparatuses such as user apparatuses and base stations will be generally referred to by communication apparatuses.

The present invention has been made in consideration of the above-mentioned points, and an object is to make it easier to identify a payload length upon decoding a bit sequence encoded by a reception side, in a radio communication system.

Means to Solve the Problem

According to a disclosed technology, a communication apparatus including an encoding unit configured to generate a second coded bit sequence by encoding according to a second encoding scheme a frozen bit sequence and a second bit sequence that includes a first bit sequence and a first coded bit sequence generated by encoding the first bit sequence according to a first encoding scheme; and a transmission unit configured to transmit a transmission signal generated from the second coded bit sequence is provided. The communication apparatus determines the second coded bit sequence on the basis of a length of the second bit sequence.

Advantageous Effects of the Invention

Thanks to the disclosed technology, a technology to make it easier to identify a payload length upon decoding a bit sequence encoded by a reception side, in a radio communication system is provided.

BRIEF DESCRIPTION OF THE DRAWINGS

FIG. 9 illustrates an encoding process according to the method 2.

FIG. 17 illustrates a comparison among the methods.

FIG. 21 illustrates an example (2) of an encoding process according to the variant 1.

FIG. 22 illustrates one example of a functional configuration of a user apparatus 10.

EMBODIMENT

Below, an embodiment of the present invention (a present embodiment) will be described. Note that the embodiment that will now be described is merely one example and embodiments to which the present invention is applied are not limited to the embodiment that will now be described.

Existing technologies may be appropriately used for a radio communication system according to the present embodiment to operate. In this regard, the existing technologies include, for example, existing LTE. However, the existing technologies are not limited to the existing LTE.

For the embodiment that will now be described, terms such as PDCCH, DCI, and RNTI will be used. In this regard, these terms will be used for convenience of description; signals, functions, and so forth of these terms or the like may be called other names.

The present embodiment uses Polar codes, which are merely one example. The present invention can transmit known bits such as frozen bits in the same way. As long as a reception side can implement decoding successively on the basis of likelihoods of a received signal, other codes than Polar codes may be applied. For example, it is possible to apply the present invention to each of LDPC (LOW DENCITY PARITY CHECK) codes and convolutional codes. In addition, Polar codes used by the present embodiment may be called another name.

According to the present embodiment, as an example of an error detection code, a CRC is used. However, an error detection code applicable to the present invention is not limited to a CRC. According to the present embodiment, a target of code/decoding is control information. However, the present invention is applicable to information other than control information. According to the present embodiment, a RNTI is used as an identifier. However, the present invention is applicable to an identifier other than a RNTI.

According to the present embodiment, a user apparatus uses a RNTI as a medium for identifying a signal transmitted to the user apparatus itself. However, a RNTI is merely one example. The present invention can be applied to not only a RNTI but also, for example, another identifier such as a user ID unique to a user apparatus. Furthermore, such an identifier may be assigned for each user apparatus and, may be applied to each plurality of user apparatuses. In addition, such an identifier may be previously determined according to a specification.

Concerning the present embodiment, downlink communication is used as a main example. However, the present invention can be applied in the same way to uplink communication and sidelink communication.

(System Overall Configuration)

Figure 1A:
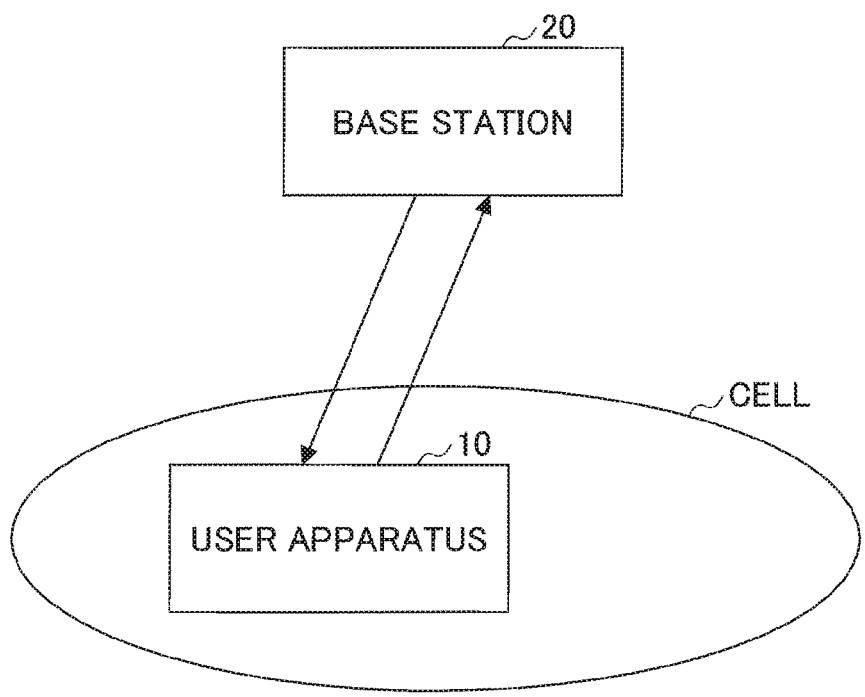
FIG. 1A is a configuration diagram of a radio communication system according to an embodiment of the present invention including a base station 20 and a user apparatus 10.
Figure 1B:
FIG. 1B is a configuration diagram of a radio communication system according to an embodiment of the present invention including a user apparatus 10 and a user apparatus 15.

FIGS. 1A and 1B illustrate configurations of radio communication systems according to the present embodiment. The radio communication system illustrated in FIG. 1A includes a user apparatus 10 and a base station 20. Although FIG. 1A illustrates the single user apparatus 10 and the single base station 20, this is an example, and, there may be a plurality of user apparatuses 10 and a plurality of base stations 20.

The user apparatus 10 is a communication apparatus having a radio communication function such as a smartphone, a cellular phone, a tablet, a wearable terminal, and a module for M2M (Machine-to-Machine) communication, wirelessly connects to the base station 20, and uses various communication services provided by the radio communication system. The base station 20 is a communication apparatus that provides one or more cells and performs radio communication with the user apparatus 10. According to the present embodiment, the duplex scheme may be a TDD (Time Division Duplex) scheme and may be a FDD (Frequency Division Duplex) scheme.

In the configuration illustrated in FIG. 1A, the base station 20, for example, encodes, using Polar codes, information obtained from adding a CRC to downlink control information (DCI), and transmits the coded information through a downlink control channel (for example, PDCCH (Physical Downlink Control Channel)). The user apparatus 10 decodes information, encoded with the use of Polar codes, according to a successive cancelation decoding (SCD) method or the like.

It is also possible to apply Polar codes to uplink control information. In this case, for example, the user apparatus 10 encodes, using Polar codes, information obtained from adding a CRC to uplink control information (UCI), and transmits the coded information through an uplink control channel (for example, PUCCH (Physical Uplink Control Channel)). The base station decodes information, encoded with the use of Polar codes, according to a successive cancelation decoding (SCD) method or the like.

FIG. 1B illustrates a case where sidelink communication is performed between user apparatuses as another example of a radio communication system according to the present embodiment. In a case of applying Polar codes to sidelink, for example, a user apparatus 10 encodes, using Polar codes, information obtained from adding a CRC to sidelink control information (SCI), and transmits the coded information through a control channel (for example, PSCCH (Physical Sidelink Control Channel)). A user apparatus 15 decodes information, encoded with the use of Polar codes, according to a successive cancelation decoding (SCD) method or the like. The same operations are carried out also in a case of communication from the user apparatus 15 to the user apparatus 10.

Figure 2:
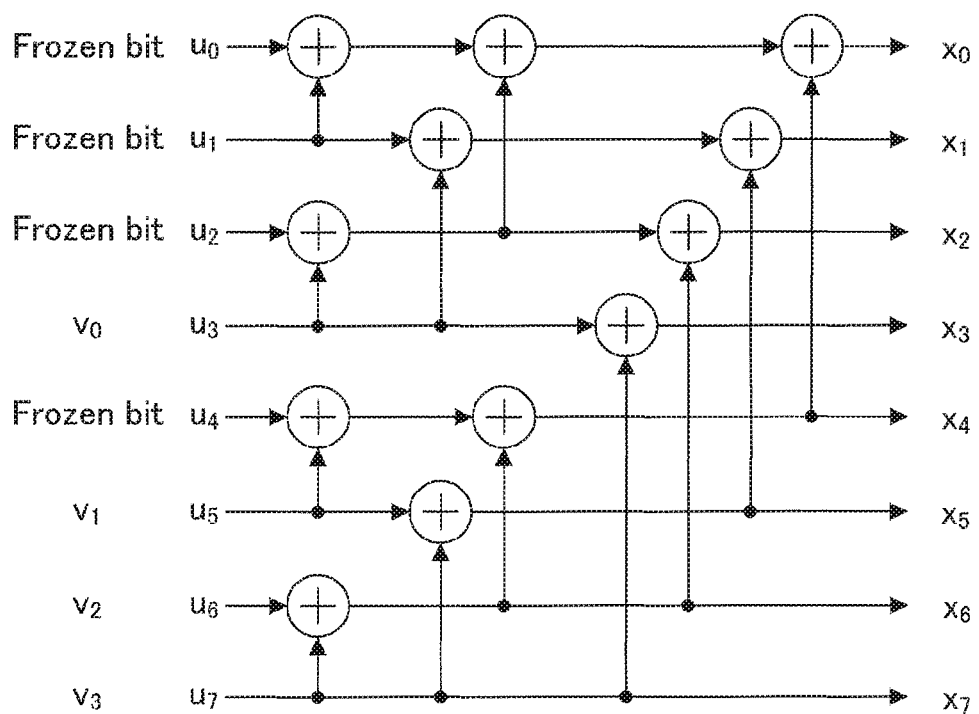
FIG. 2 illustrates an example of Polar encoding.

(Polar code) According to the present embodiment, Polar codes are used. Therefore, encoding and decoding Polar codes will be described. Because encoding and decoding Polar codes themselves are well known, only an outline will now be described (see Non-patent document 1 for details). Concerning Polar codes, through repetitious combining and splitting, a plurality of channels are converted to polarized communication paths, and thus, the channels are classified into channels having high quality and channels having low quality. Then, information bits are allocated to channels having high quality and frozen bits that are known signals are allocated to channels having low quality. FIG. 2 illustrates an encoder for Polar codes for a case of 3 repetitions. As illustrated in FIG. 2, the encoder has a configuration where communication paths are coupled through an exclusive-or operation.

Inputs to the Polar encoder have $N=2^n$ bits, i.e., $u_0, \ldots,$ and $u_{N-1}$. Assuming that K bits ($v_0, \ldots, v_{K-1}$) are information bits, (N-K) bits are frozen bits. Coded bits that are output from the encoder have N bits ($x_0, \ldots, x_{N-1}$). FIG. 2 illustrates an example of N=8 and K=4. Note that, in the description of the present embodiment, the value of a bit may be referred to by "bit".

Polar encoding can be expressed by the following expression. The matrix illustrated below corresponds to the encoder of FIG. 2.

$$(x_0, \ldots, x_{N-1}) = (u_0, \ldots, u_{N-1})G, \quad G = \begin{pmatrix} 1 & 0 \\ 1 & 1 \end{pmatrix}^{\otimes n}$$

A frozen bit may be any bit as long as the bit is known on a transmission side and a reception side. In many cases, 0 is used as a frozen bit.

As a basic decoding method to decode a Polar code, a Successive Cancellation Decoding (SCD) method will now be described. According to the successive cancellation decoding method, on a reception side, a likelihood (specifically, for example, a log-likelihood ratio (LLR)) obtained from modifying each bit is input to a decoder and a predetermined calculation is performed on the likelihood in sequence. Thus, transmitted bits are successively decoded from $u_0$. Specifically, a likelihood of each transmitted bit is calculated and, on the basis of the likelihood, a value of the bit is determined. Concerning a frozen bit, the value of the frozen bit is used as a decoding result.

Figure 3:
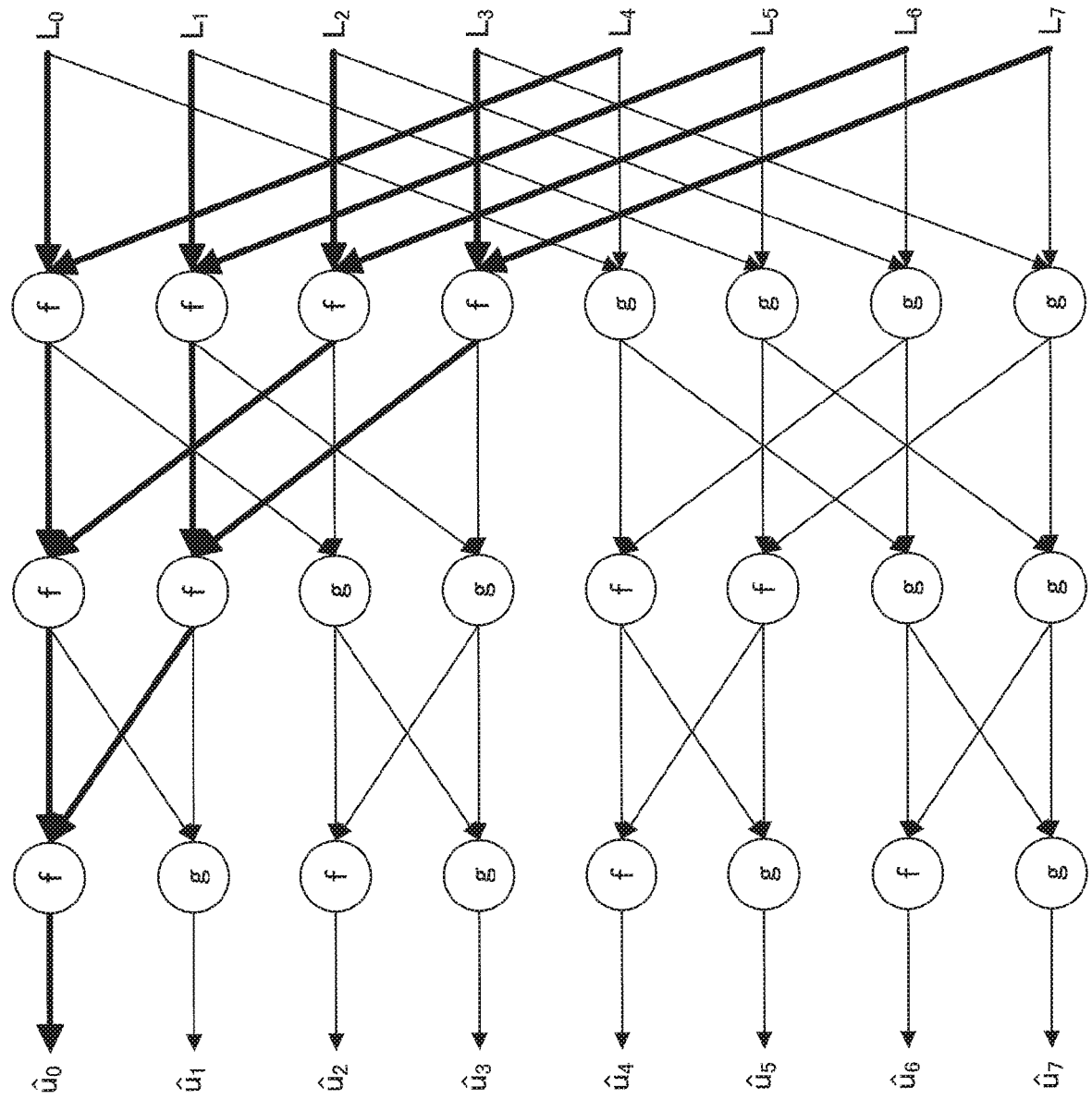
FIG. 3 illustrates an example of decoding a Polar code.
Figure 4:
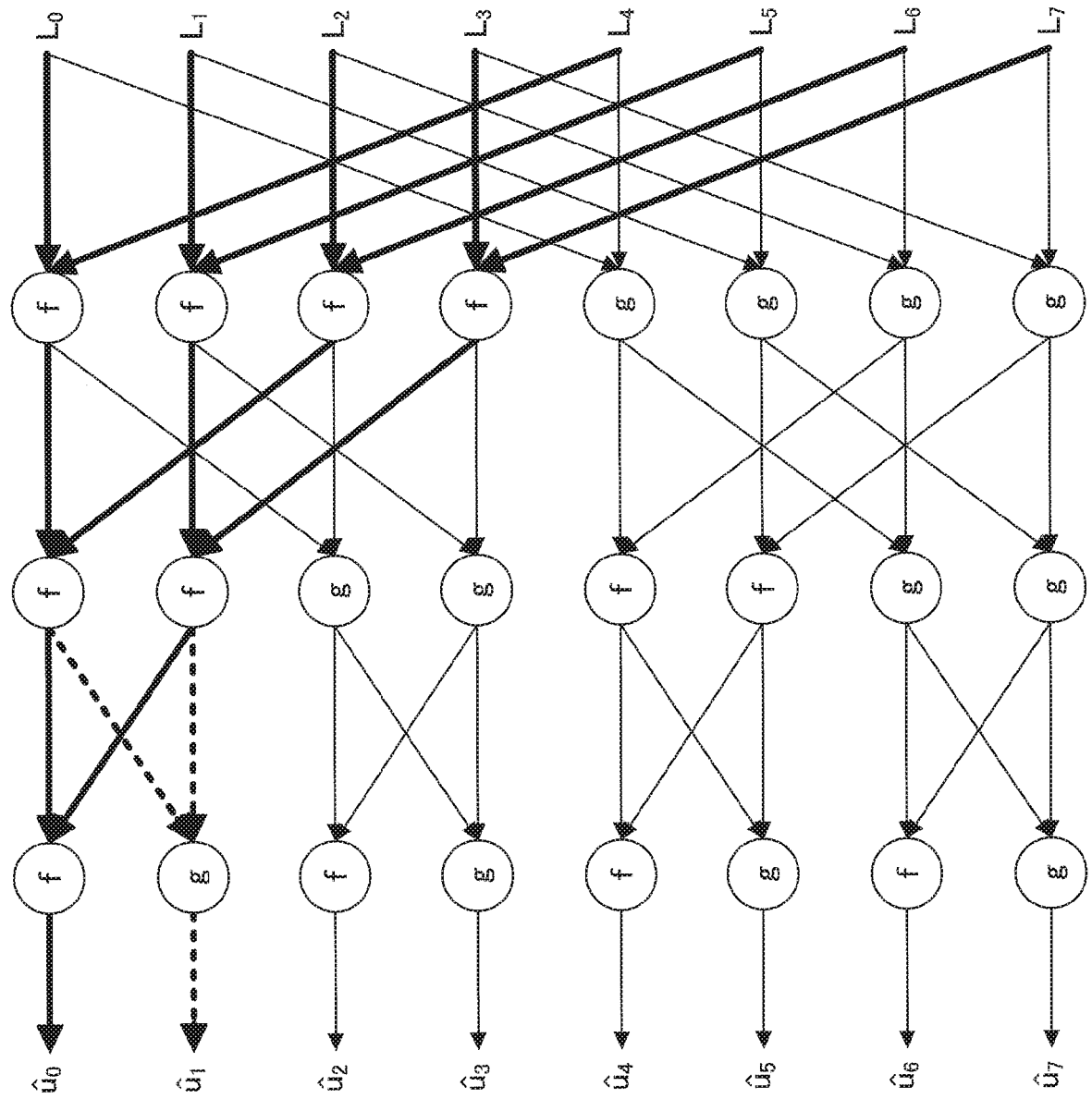
FIG. 4 illustrates an example of decoding a Polar code.
Figure 5:
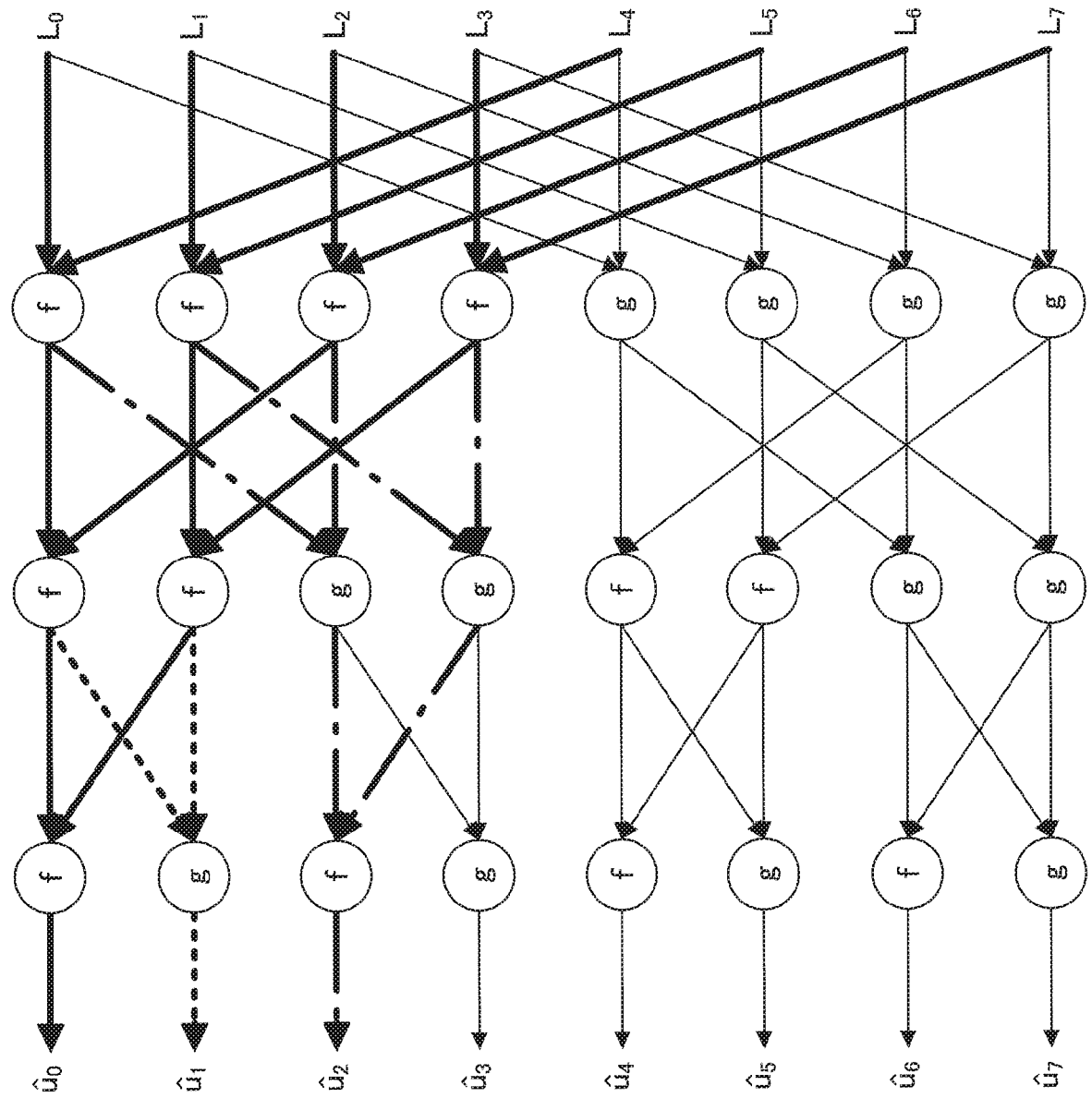
FIG. 5 illustrates an example of decoding a Polar code.

FIGS. 3-5 illustrate an example of a successive calculation. Through the respective steps illustrated in FIGS. 3-5, decoding of $u_0$, $u_1$, and $u_2$ is implemented. In the drawings, f denotes a calculation not directly using known information (values of bits for which decoding results have already been obtained, values of frozen bits); g denotes a calculation using known information. In decoding a Polar code, $u_0, \ldots,$ and $u_{i-1}$ need to be known to decode $u_i$. Therefore, decoding should be performed in the order of $u_0$, $u_1$, $u_2, \ldots$.

Below, as encoding and decoding methods according to the present embodiment, a method 1, a method 2, and a method 3 will be described. The method 3 is a main method of the present invention. To the method 3, the method 1 and/or the method 2 may be combined. Therefore, also the method 1 and the method 2 will be described as methods according to the present embodiment. Note that the present invention is not limited to the method 3.

In the description for each method, downlink communication of transmitting from a base station 20 to a user apparatus 10 is assumed. However, also to uplink communication from a user apparatus 10 to a base station 20 and sidelink communication between user apparatuses, the same methods as the methods 1-3 for encoding and decoding that will be described now can be applied. A target to which each method is applied is not limited to control information.

Hereinafter, information such as downlink control information that is a target of encoding will be referred to by "target information". In each drawing, target information is expressed as "info" (an abbreviation of information). Frozen bits are expressed as "frozen".

(Method 1)
<Encoding According to Method 1>

Figure 6A:
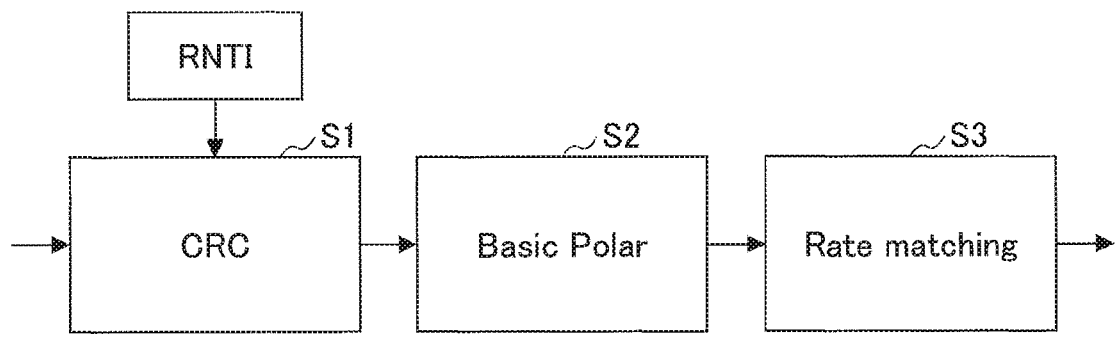
FIG. 6A illustrates an encoding process according to a method 1 and illustrates an outline of a flow of the process.
Figure 6B:
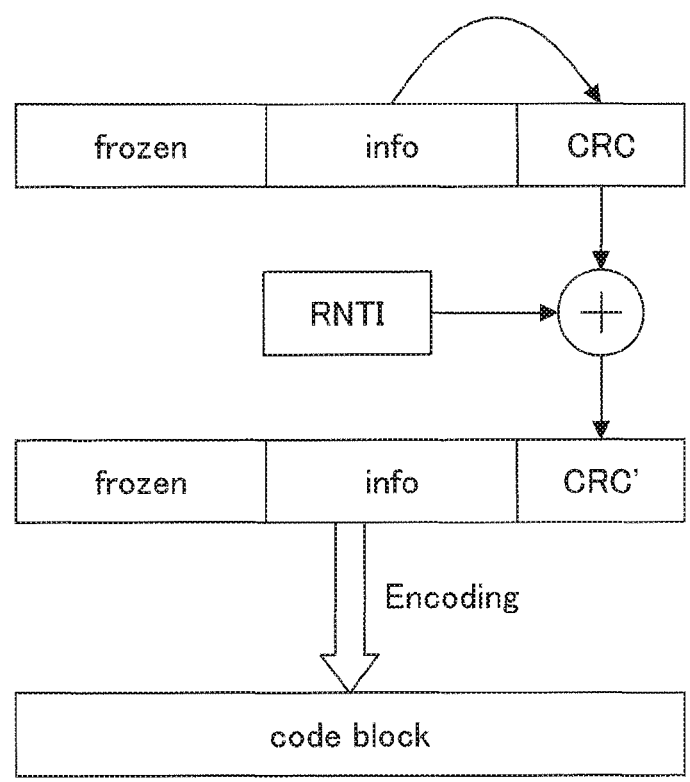
FIG. 6B illustrates an encoding process according to the method 1 and illustrates operations of encoding.

With reference to FIGS. 6A and 6B, an encoding process according to the method 1 will now be described. FIG. 6A illustrates an outline of a flow of a process in the base station 20. The base station 20 attaches a CRC to target information and masks the CRC with a RNTI as in existing LTE (step S1). Masking according to the present embodiment means performing an exclusive-or operation on a per bit basis. Masking may be called scrambling. A RNTI is an identifier to identify a user apparatus and/or a channel and may be of one of various types (Non-patent document 3). For example, a C-RNTI is a RNTI for transmitting or receiving user data; a SPS (Semi Persistent Scheduling)-RNTI is a RNTI for transmitting and receiving data concerning SPS; a P-RNTI is a RNTI for transmitting and receiving paging; and a SI-RNTI is a RNTI for transmitting and receiving broadcast information (system information to be broadcasted). The base station 20 selects a RNTI, depending on a current operation, to use for masking.

The base station 20 performs Polar encoding on information obtained in step S1 (step S2) and performs rate matching on the coded information through puncturing or the like (step S3). A transmission signal is produced from the coded information on which rate matching has been thus performed and the transmission signal is transmitted wirelessly.

With reference to FIG. 6B, an encoding operation will be described in detail. As illustrated in FIG. 6B, the base station 20 attaches a CRC to information that includes frozen bits and target information, and performs masking on the CRC with a RNTI. The CRC on which masking has been performed with the RNTI is indicated as a CRC'. Note that the base station 20 may calculate the CRC from only the target information and may calculate the CRC from information that includes the frozen bits and the target information.

The base station 20 encodes the thus generated "frozen bits+target bits+CRC'" to obtain a coded block.

<Decoding According to Method 1>

Figure 7A:
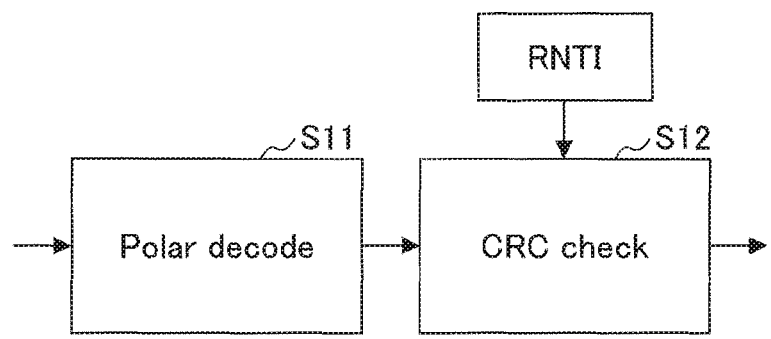
FIG. 7A illustrates a decoding process according to the method 1 and illustrates an outline of a flow of the process.
Figure 7B:
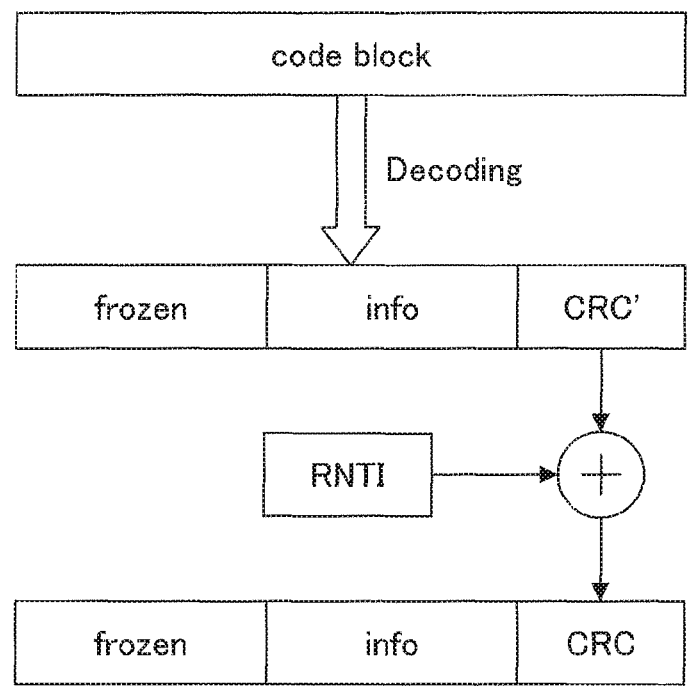
FIG. 7B illustrates a decoding process according to the method 1 and illustrates operations of decoding.

With reference to FIGS. 7A and 7B, a decoding process according to the method 1 will be described. FIG. 7A illustrates an outline of a flow of a process in the user apparatus 10. The user apparatus 10 demodulates, for example, a signal received at a search space of a PDCCH, performs a decoding process (step S11), applies a RNTI on the information thus obtained in the decoding process, and performs CRC check (step S12). For a case where the CRC check is successful, the user apparatus 10 uses the obtained target information.

With reference to FIG. 7B, a decoding operation will be described in detail. The user apparatus 10 decodes a code block received from the base station 20. Then, the user apparatus 10 performs unmasking on a CRC' with a RNTI and performs CRC check with the use of the thus obtained a CRC. For a case where the CRC check is successful, the user apparatus 10 determines that the target information is addressed to the user apparatus 10 and uses the target information. In addition, the user apparatus 10 can determine, from the type of the RNTI with which the CRC check is successful, the type of the channel (data).

The user apparatus 10 may use only SCD in decoding; may use a Successive Cancellation List Decoding (SCLD) method; and may use a CRC-aided SCLD method using a CRC.

In a case of using SCLD, the user apparatus 10 determines L sequences having a high likelihood as surviving paths (L will be referred to as a list size), determines the sequence having the highest likelihood as a decoding result, applies a RNTI to the decoding result, and performs CRC check.

In a case of using CRC-aided SCLD, the user apparatus 10 applies a RNTI to and performs CRC check on each of the L sequences, and uses a sequence for which CRC check is successful as a decoding result.

(Method 2)

<Coding According to Method 2>

Figure 8A:
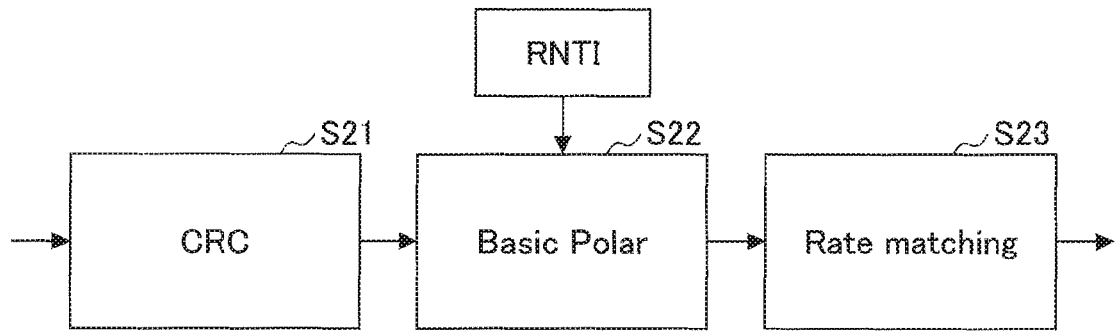
FIG. 8A illustrates an encoding process according to a method 2 and illustrates an outline of a flow of the process.
Figure 8B:
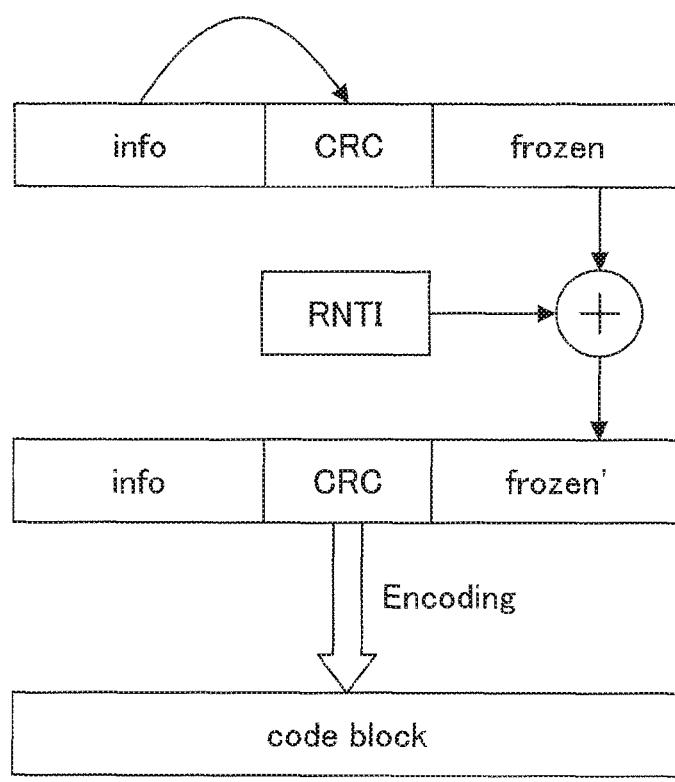
FIG. 8B illustrates an encoding process according to the method 2 and illustrates operations of encoding.

With reference to FIGS. 8A, 8B, and 9, an encoding process according to the method 2 will be described. FIG. 8A illustrates an outline of a flow of a process in the base station 20. The base station 20 calculates a CRC and attaches the CRC to target information (step S21).

The base station 20 Polar encodes information in which a RNTI is applied to frozen bits (step S22) and performs rate matching on the coded information through puncturing or the like (step S23). A transmission signal is generated from the coded information on which the rate matching has been performed and is transmitted wirelessly.

With reference to FIG. 8B, an encoding operation will be described in detail. In a Polar encoding process, the base station 20 attaches frozen bits to "target information+CRC". Instead, the base station 20 may produce "target information+frozen bits" before attaching a CRC, calculate a CRC from "target information+frozen bits", and attach the CRC to "target information+frozen bits".

Then, the base station 20 performs masking on the frozen bits included in "target information+CRC+frozen bits" using a RNTI. For example, assuming that the bit length of the frozen bits is the same as the bit length of the RNTI and all of the frozen bits are 0, the frozen bits on which a RNTI masking has been performed are the same bits as those of the RNTI.

The bit length of frozen bits may be different from the bit length of a RNTI. For example, it will now be assumed that the bit length of a RNTI is 4 bits, which have the values ($a_0$, $a_1$, $a_2$, $a_3$), and the bit length of frozen bits is 8 bits, each of which has the value 0. In this case, the base station 20, for example, performs masking the frozen bits using "RNTI+RNTI" and obtains ($a_0$, $a_1$, $a_2$, $a_3$, $a_0$, $a_1$, $a_2$, $a_3$) as frozen bits on which the masking has been performed. In this case, to use "RNTI+RNTI" for masking (i.e., using connected RNTIs) is known by the user apparatus 10. Alternatively, to use "RNTI+RNTI" may be indicated by the base station 20 to the user apparatus 10 through higher layer signaling or broadcast information.

In a case where the bit length of a RNTI is greater than the bit length of frozen bits, the base station 20, for example, applies a hash function to a RNTI to shorten the RNTI to make the RNTI have the same length as the length of the frozen bits, and uses the shortened RNTI for a masking process. To use the RNTI to which the hash function has been applied for a masking process is known also by the user apparatus 10. Alternatively, to use the RNTI to which the hash function has been applied for a masking process may be indicated by the base station 20 to the user apparatus 10 through higher layer signaling or broadcast information.

As illustrated in FIG. 8B, the base station 20 encodes "target information+CRC+frozen'" generated as mentioned above to obtain a code block.

FIG. 9 illustrates an encoding process for a case of N=8; N−K=4. As illustrated in FIG. 9, bits ($a_0$, $a_1$, $a_2$, $a_3$) of a RNTI as frozen bits to which the RNTI has been applied are input to an encoder; information bits are input to the encoder. The information bits are "target information+CRC".

According to the example illustrated in FIG. 9, from among 8 coded bits, $x_0'$ and $x_1'$ are punctured; resource mapping and so forth are then performed on the remaining 6 bits, which are then transmitted. Puncturing is used to, for example, make the number of bits to be transmitted match a transmission resource amount. Concerning a puncturing method for a Polar code such as a method to determine bits to be punctured, there are various existing methods (example: QUP (quasi-uniform puncturing)), which can be used.

<Decoding According to Method 2>

Figure 10A:
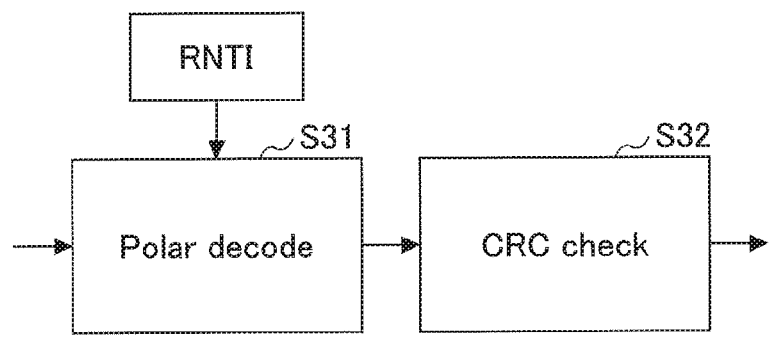
FIG. 10A illustrates a decoding process according to the method 2 and illustrates an outline of a flow of the process.

Next, with reference to FIGS. 10A, 10B, and 11, a decoding process according to the method 2 will be described. FIG. 10A illustrates an outline of a flow of a process in the user apparatus 10. A user apparatus 10 demodulates a signal received, for example, at a search space of a PDCCH; performs a decoding process on the thus obtained information (a code block) using a RNTI (step S31); and performs CRC check on the thus obtained information (step S32).

Figure 10B:
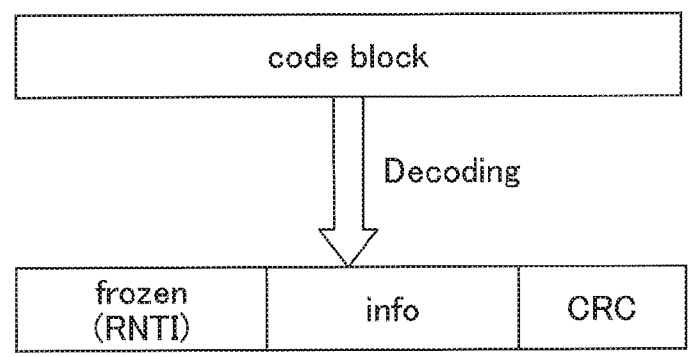
FIG. 10B illustrates a decoding process according to the method 2 and illustrates operations of decoding.

With reference to FIG. 10B, a decoding operation will be described in detail. Now, it will be assumed that frozen bits (frozen') at an encoding side are a RNTI itself; this fact is known by the user apparatus 10. Therefore, the user apparatus 10 performs a decoding process assuming that frozen bits are the RNTI. Thereafter, the user apparatus 10 performs CRC check. If the CRC check is successful, the user apparatus 10 determines that the target information is target information addressed to the user apparatus 10 and uses the target information. In addition, the user apparatus 20 can determine, from the type of the RNTI with which the CRC check has been successful, the type of the channel (data). Also according to the method 2, the user apparatus 10 may use SCD, may use SCLD, and may use CRC-aided SCLD in decoding, as according to the method 1.

Figure 11:
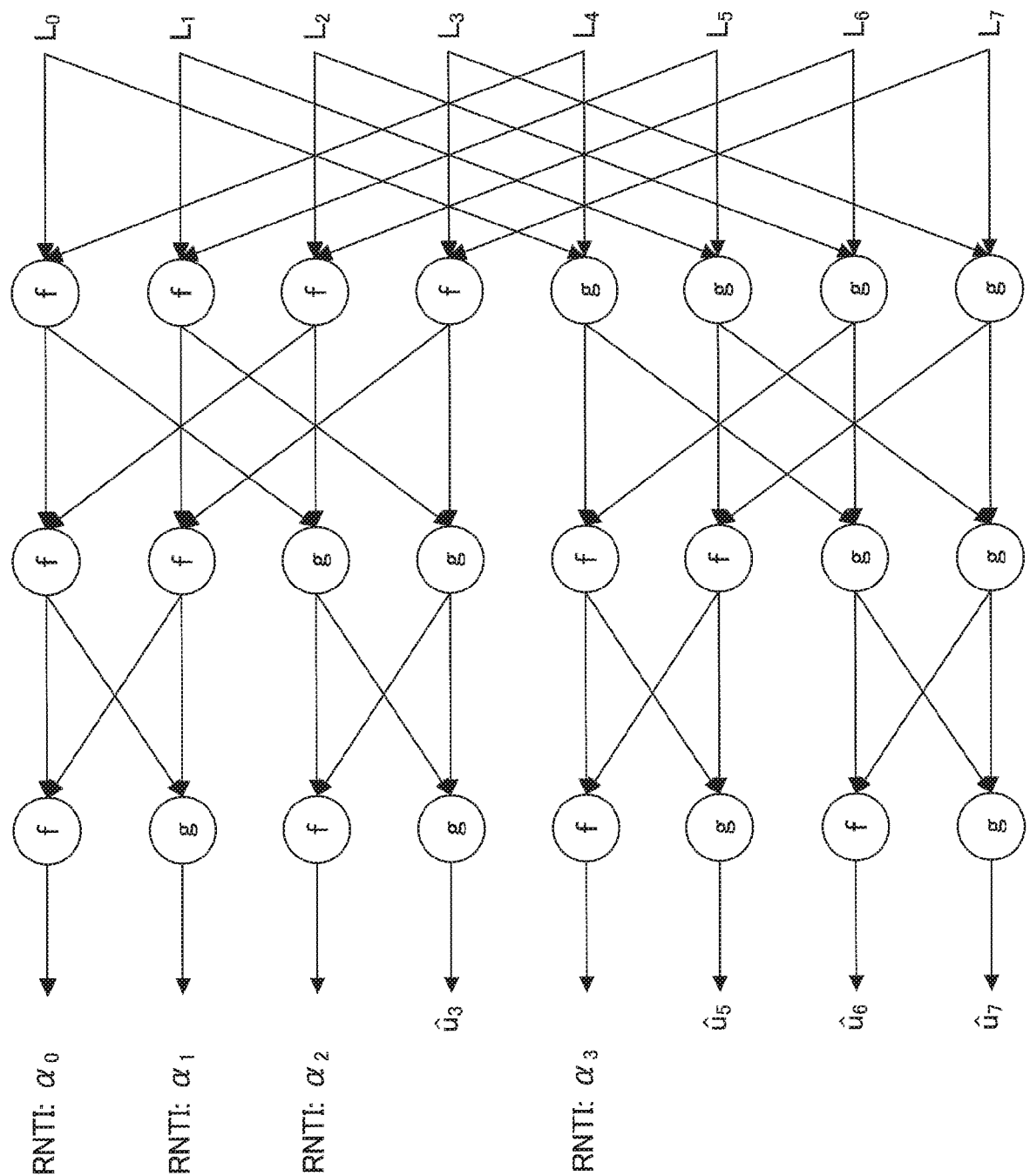
FIG. 11 illustrates a decoding process according to the method 2.

FIG. 11 illustrates a decoding process corresponding to the encoding process (N=8; N−K=4) of FIG. 9. As illustrated in FIG. 11, a RNTI is used as frozen bits. As described above, in a decoding process, upon decoding $u_1$, known values (frozen bits or decoded bits) $u_0, \ldots, u_{i-1}$ are used. Therefore, in the decoding process illustrated in FIG. 11, $a_0$, $a_1$, and $a_2$ are used for decoding $u_3$; $a_0, a_1, a_2,$ and $a_3$ are used for decoding $u_5$, $u_6$, and $u_7$.

For example, in a case where there are a plurality of RNTIs available to the base station 20, the user apparatus 10 uses each of the RNTIs as frozen bits to perform a decoding process. Then, the user apparatus 10 can determine that a RNTI resulting in CRC check being successful is a RNTI applied by the base station 20. For example, in a case where, as a result of the user apparatus 10 using each of a P-RNTI and a SI-RNTI to perform a decoding process and CRC check, CRC check is successful for a case of using SI-RNTI, the user apparatus 10 can determine that the user apparatus 100 will receive broadcast information.

(Method 3)

Figure 12:
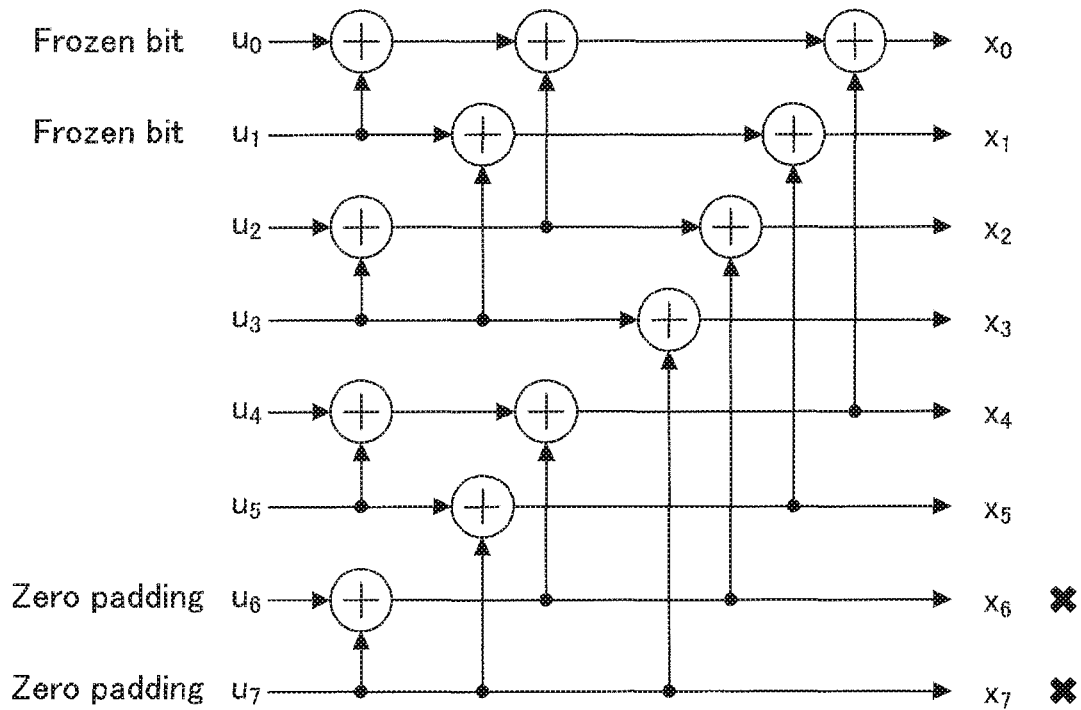
FIG. 12 illustrates an example of a shortened Polar code.

According to the method 3, an encoding side uses a shortened Polar code where the length of bits (information bits+frozen bits) that are input is shortened. FIG. 12 illustrates one example of a shortened Polar code. In the example illustrated in FIG. 12, to an encoder to which 8 bits are input, information bits+frozen bits having 6 bits are input. In this case, 2 bits are used as padding bits. Then, coded bits corresponding to the padding bits are punctured. A reception side performs a decoding process assuming that likelihoods of the punctured bits are determined as, for example, likelihoods (for example, +∞) that indicate 0. The punctured bits are known on the reception side.

<Coding According to Method 3>

Figure 13A:
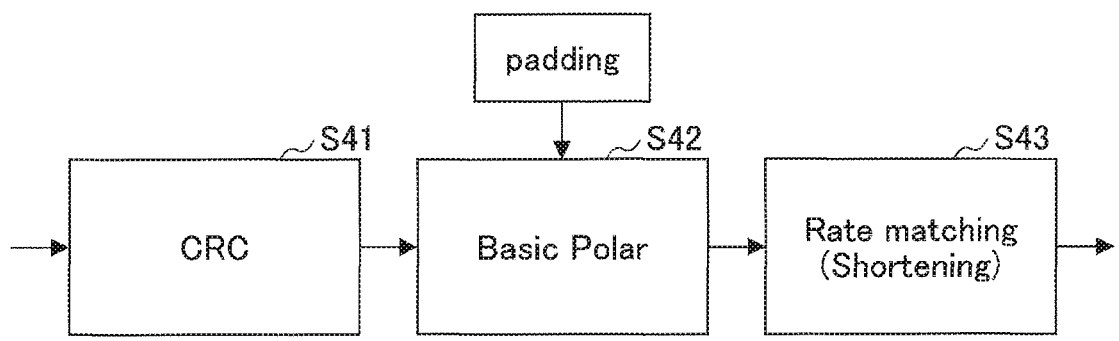
FIG. 13A illustrates an encoding process according to a method 3 and illustrates an outline of a flow of the process.
Figure 13B:
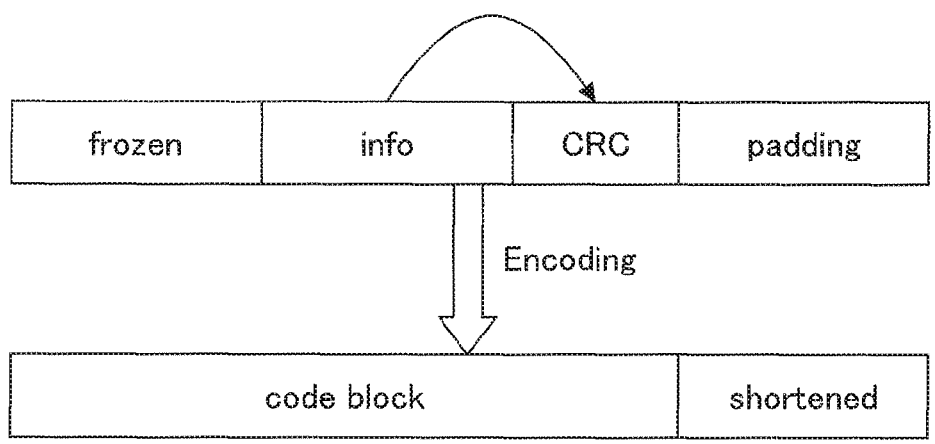
FIG. 13B illustrates an encoding process according to the method 3 and illustrates operations of encoding.
Figure 14:
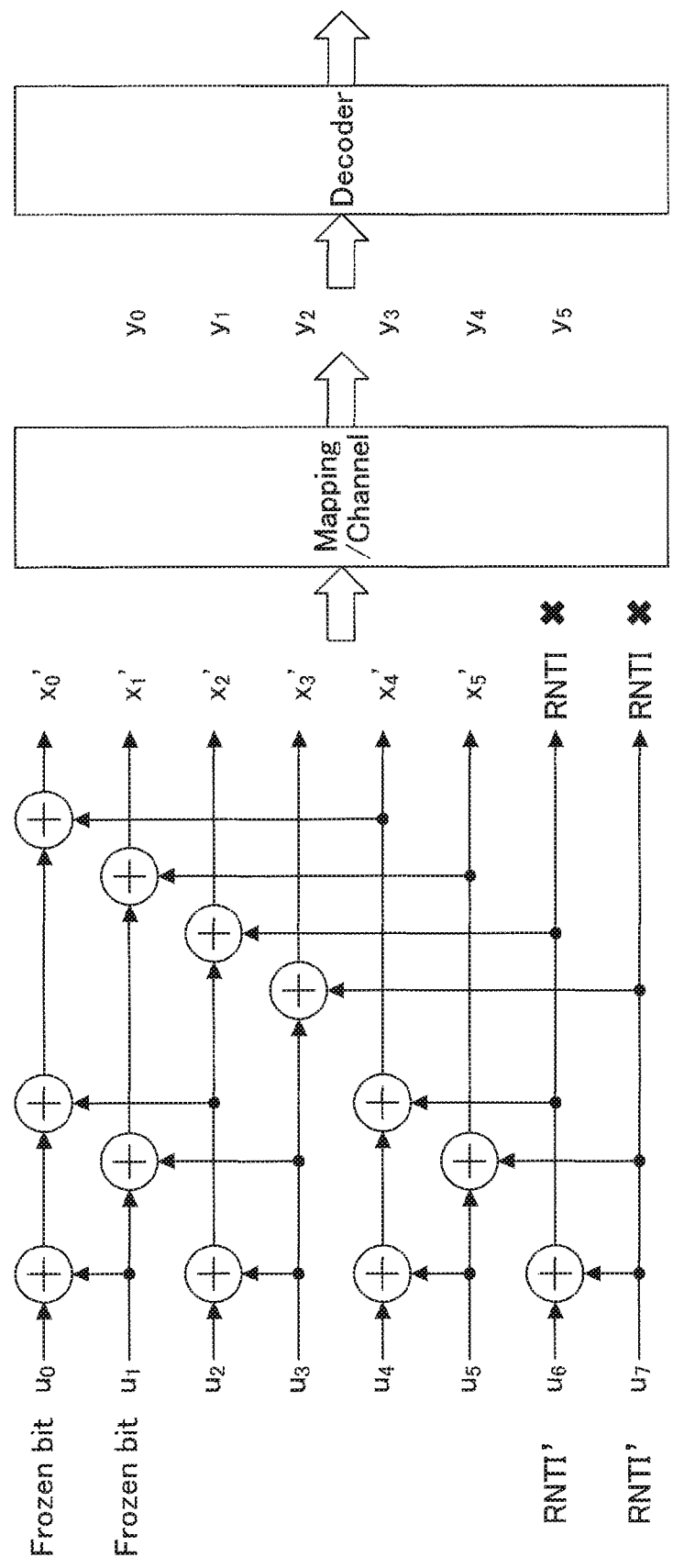
FIG. 14 illustrates an encoding process according to the method 3.

With reference to FIGS. 13A, 13B, and 14, an encoding process according to the method 3 will be described. FIG. 13A illustrates an outline of a flow of a process in the base station 20. The base station 20 calculates a CRC for target information and attaches the CRC to the target information (step S41). The base station 20 attaches padding bits, performs Polar encoding (step S42), and performs rate matching (shortening) through puncturing on the coded information (step S43). A transmission signal is produced from the coded information on which the rate matching has been performed and is transmitted wirelessly.

With reference to FIG. 13B, an encoding operation will be described in detail. The base station 20 attaches frozen bits to "target information+CRC" in a Polar encoding process. It is also possible that the base station 20 produces "frozen bits+target information" before attaching a CRC, calculates a CRC from "frozen bits+target information", and attaches the CRC to "frozen bits+target information".

Then, the base station 20 attaches padding bits to "frozen bits+target information+CRC". The bit length of "frozen bits+target information+CRC+padding bits" is a bit length ($N=2^n$) of an input of the Polar encoder.

Padding bits according to the present embodiment are bits that become a RNTI through an encoding process. In other words, padding bits are obtained from applying an inverse function of encoding to a RNTI. The bit length of padding bits may be the same as or different from the bit length of a RNTI.

For example, if the bit length of padding bits is greater than the bit length of a RNTI, for example, information where a plurality of RNTIs are connected together (for example, RNTI+RNTI) is used as a RNTI to generate padding bits, and a decoding process that will be described later is performed. If the bit length of padding bits is smaller than the bit length of RNTI, for example, a hash function is applied to the RNTI to shorten the RNTI, the shortened RNTI is used as a RNTI to generate padding, and a decoding process that will be described later is performed.

The padding bits (bit positions and their values) are known in the user apparatus 10. In detail, the user apparatus 10 has the same inverse function as an inverse function that the base station 20 has, and calculates the padding bits from a RNTI using the inverse function. Alternatively, the base station 20 may indicate an inverse function used by the base station 20 to the user apparatus 10 through higher layer signaling or broadcast information.

In addition, in a case where the base station 20 uses padding bits longer than a RNTI or in a case where the base station 20 uses padding bits shorter than a RNTI as mentioned above, the fact is known by the user apparatus 10. It is also possible that the base station 20 indicates the fact to the user apparatus through higher layer signaling or broadcast information.

The base station 20 encodes "frozen bits+target information+CRC+padding bits" to obtain coded information. The coded information includes a code block that is the coded information of "frozen bits+target information+CRC" and a RNTI that is coded information of padding bits. The base station 20 punctures the RNTI in a rate matching process; therefore, in FIG. 12, the corresponding section is indicated as shortened.

FIG. 14 illustrates an encoding process for a case of N=8 ($2^3$). Assuming that K denotes the bit length of information bits and M denotes the bit length of "frozen bits+information bits", the bit length of frozen bits is M−K and the bit length of padding bits is N−M. FIG. 14 illustrates a case of K=4 and M=6; frozen bits have 2 bits ($u_0$, $u_1$) and padding bits have also 2 bits ($u_6$, $u_7$).

As illustrated in FIG. 14, the frozen bits ($u_0$, $u_1$), the information bits ($u_2$-$u_5$), and the padding bits ($u_6$, $u_7$) are input to an encoder and coded bits are output. The information bits correspond to "target information+CRC". Coded bits ($x_6'$, $x_7'$) corresponding to the padding bits ($u_6$, $u_7$) become a RNTI. The bits of the RNTI are punctured; resource mapping is performed on the remaining 6 bits, which are then transmitted.

Even in a case where, for example, the length of input information (target information+CRC+frozen bits) is $N=M=2^n$, it is possible to apply the method 3 by shortening the input information.

<Decoding According to Method 3>

Figure 15A:
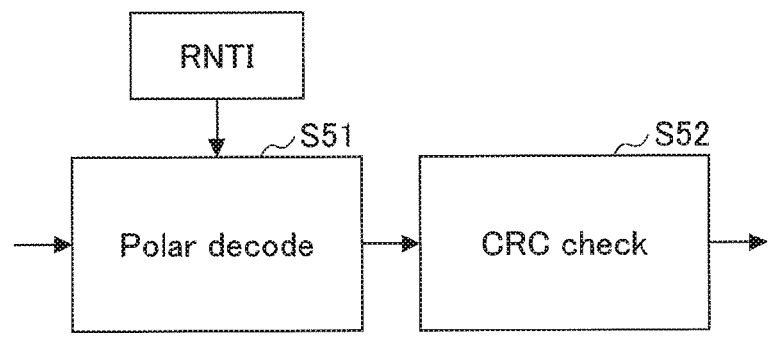
FIG. 15A illustrates a decoding process according to the method 3 and illustrates an outline of a flow of the process.

Next, with reference to FIGS. 15A, 15B, and 16, a decoding process according to the method 3 will be described. FIG. 15A illustrates an outline of a flow of a process in the user apparatus 10. As illustrated in FIG. 15A, the user apparatus 10 demodulates a signal received at, for example, a search space of a PDCCH, performs a decoding process on the thus obtained information (a likelihood for each bit) using a RNTI (step S51), and performs CRC check on the thus obtained information (step S52). In the decoding process, the values of frozen bits and the values of padding bits, as known information, are used.

Figure 15B:
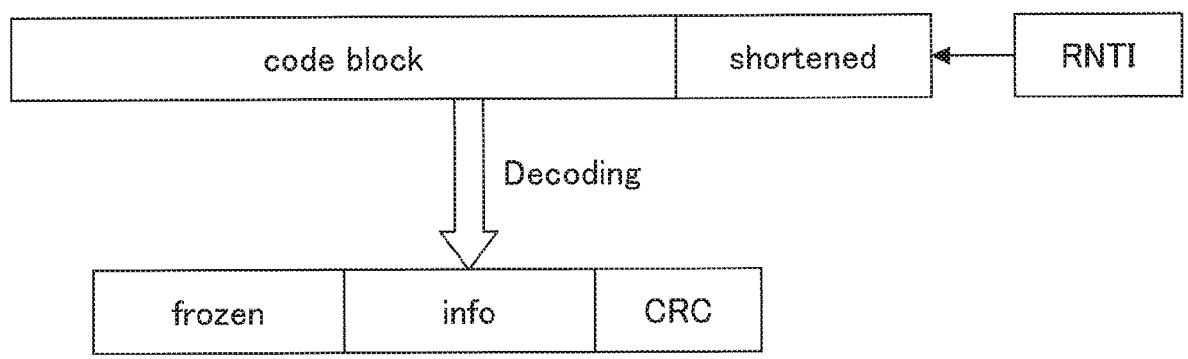
FIG. 15B illustrates a decoding process according to the method 3 and illustrates operations of decoding.
Figure 16:
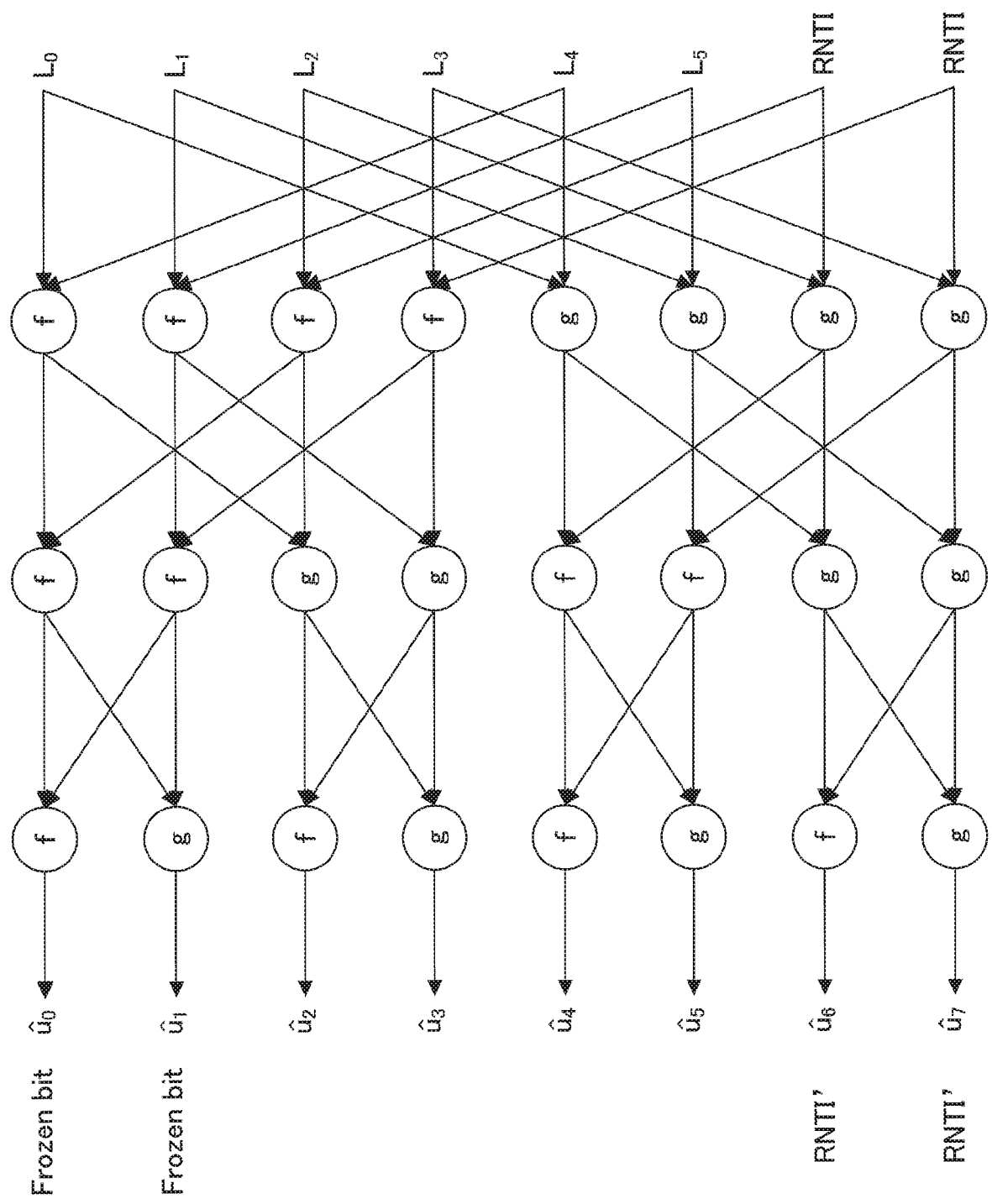
FIG. 16 illustrates a decoding process according to the method 3.

With reference to FIGS. 15B and 16, a decoding operation will be described in detail. It will now be assumed that, on an encoding side, bits obtained from encoding padding bits are used as a RNTI and are punctured. The user apparatus 10 performs a decoding process using received bits and the RNTI as values of punctured bits (the section "shortened" in FIG. 15B). Thereafter, the user apparatus 10 performs CRC check. If the CRC check is successful, the user apparatus 10 determines that the target information is directed to the user apparatus 10 and uses the target information. In addition, the user apparatus 10 can determine, from the type of the RNTI with which the CRC check has been successful, the type of the channel (data). Also according to the method 3, as according to the methods 1 and 2, the user apparatus 10 may use SCD, may use SCLD, and may use CRC-aided SCLD in the decoding.

FIG. 16 illustrates a decoding process corresponding to the encoding process (N=8, K=4, and M=6) of FIG. 14. As illustrated in FIG. 16, as inputs to a decoder (the right side in FIG. 16), the likelihoods of respective bits are input. For the punctured bits, the likelihoods indicating the values of the RNTI are used. For example, if the value of a bit is 0, a positive great value (for example, +∞) is used as a likelihood; if the value of a bit is 1, a negative great value (for example, −∞) is used as a likelihood.

The user apparatus 10 performs the decoding process using known information for the values $(u_0, u_1)$ of frozen bits and the values $(u_6, u_7)$ of padding bits on the output side.

For example, for a case where a plurality of RNTIs are applicable by the base station 20, the user apparatus 10 performs, for each of the RNTIs, a decoding process using the likelihoods corresponding to the respective bits of the RNTI as the inputs. In response to CRC check being successful, the user apparatus 10 can determine that the RNTI used in the CRC check is the RNTI applied by the base station 20. For example, in a case where the user apparatus 10 uses each of a P-RNTI and a SI-RNTI to perform a decoding process and CRC check resulting in CRC check being successful with the SI-RNTI, the user apparatus 10 can determine that the user apparatus 10 will receive broadcast information from the base station 20.

Note that, in the above-mentioned example, the transmission side punctures all of the bits corresponding to the RNTI. However, such a manner is one example. Instead, the transmission side may puncture some bits from among all of the bits corresponding to the RNTI and may puncture none of the bits corresponding to the RNTI. Even in a case of not performing puncturing, the transmission side can perform the decoding process illustrated in FIG. 16.

Furthermore, concerning the method 3, a RNTI is used as padding bits; and, as values to be used as likelihood inputs on a decoding side, values obtained from applying an inverse function to the RNTI may be used.

(Combinations of Methods 1-3)

The base station 20 may combine, in an encoding process according to the method 3, for example, the method 1 and/or the method 2. For example, the base station 20 performs masking on a CRC and/or frozen bits illustrated in FIG. 13B using a RNTI. In a case where a RNTI is used for masking of frozen bits, the user apparatus 10 performs a decoding process using the RNTI as frozen bits. In a case where a RNTI is used for masking of a CRC, the user apparatus 10 performs unmasking of the CRC, obtained from a decoding process, using the RNTI to perform CRC check.

By performing combining as mentioned above, the false detection rate seems to be improved in comparison to a case of not performing combining.

(Summary and Advantageous Effects of Methods 1-3)

FIG. 17 illustrates features of the methods 1-3. According to the method 1, a RNTI is applied to a CRC and, after a decoding process, the RNTI is used for unmasking. According to the method 2, a RNTI is applied to frozen bits and, the RNTI is used before a decoding process. According to the method 3, a RNTI is applied to padding bits and, the RNTI is used before a decoding process.

Concerning a FAR (False Alarm Rate or a false detection rate), according to the method 1, a FAR depends on the length of a CRC. Therefore, in order to improve a FAR, more CRC bits are needed resulting in an overhead increase. According to the method 2, it is possible to reduce a false detection rate without increasing the overhead. However, characteristics of the method 2 may be unstable or robustness may be insufficient. According to the method 3, it is possible to reduce a false detection rate depending on the length of padding bits. Note that it is possible to use some of frozen bits as padding bits, whereby it is possible to reduce the overhead with respect to the method 3.

Figure 18:
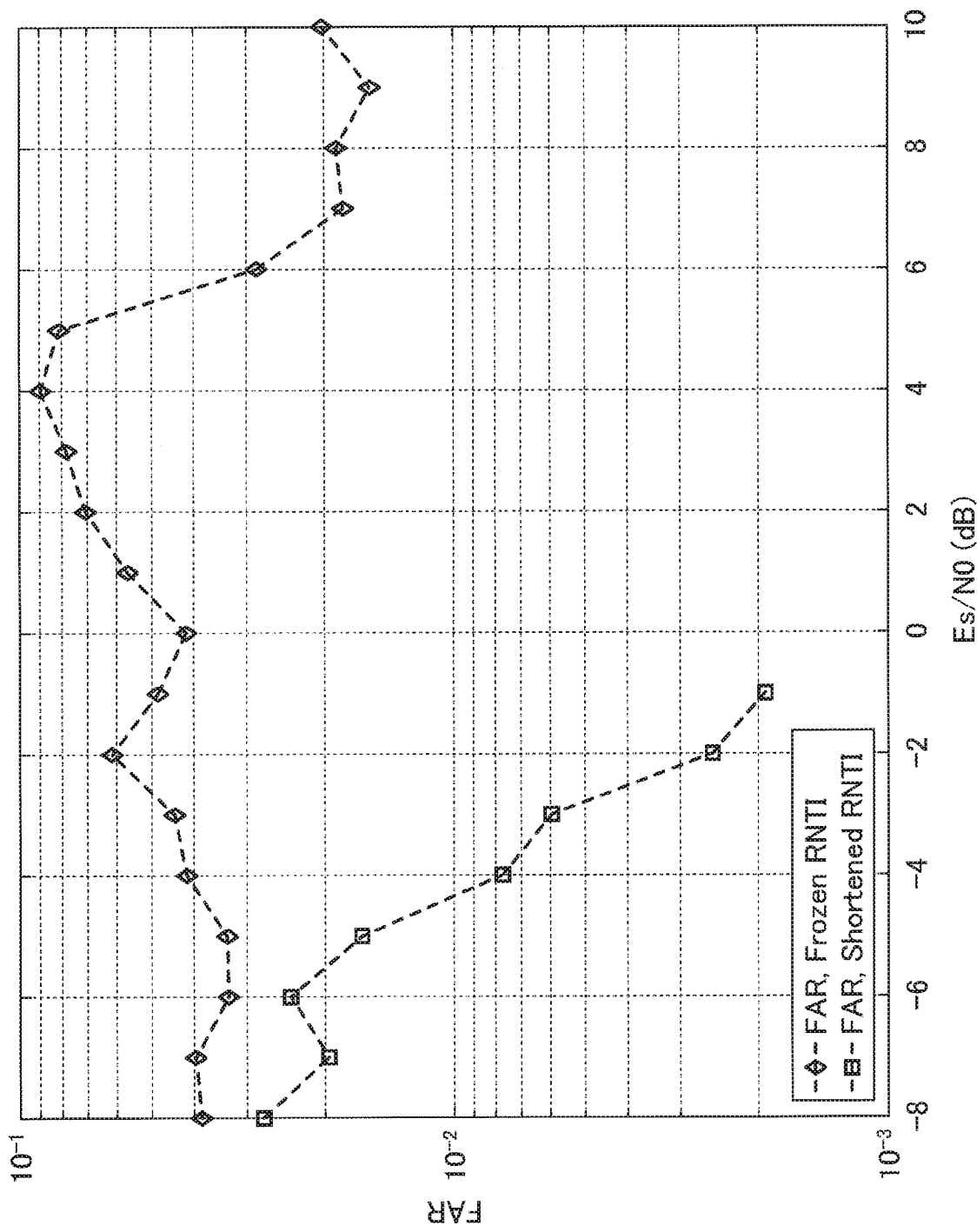
FIG. 18 illustrates effects.

FIG. 18 illustrates FAR evaluation results of the methods 2 and 3. In FIG. 18, "Frozen RNTI" denotes the method 2 and "Shortened RNTI" denotes the method 3. The abscissa axis of FIG. 18 denotes Es/N0 (a signal-to-noise ratio); the ordinate axis denotes a FAR. As illustrated in FIG. 18, it can be seen that the method 3 has a better FAR than the method 2. For example, assuming that 2 RNTIs differ by only 1 bit (for example: RNTI=0000; RNTI=0001), it is possible to identify them according to the method 3 better than the method 2.

The method 1 is similar to a scheme according to the existing LTE and therefore, implementation may be relatively easier. According to the method 2, because a RNTI is applied to frozen bits, padding bits need not be attached; furthermore, on a decoding side, unmasking of a CRC and so forth are not needed. Therefore, concerning these points, the process loads seem lower. As described above, the method 3 has an advantageous effect of having a better FAR.

(Variant 1)

Next, a variant 1 of the above-described methods 1-3 will be described. Points at which the variant 1 is different from the method 1-3 will now be described. Therefore, points not particularly specified may be the same as or similar to those of the methods 1-3.

Figure 19:
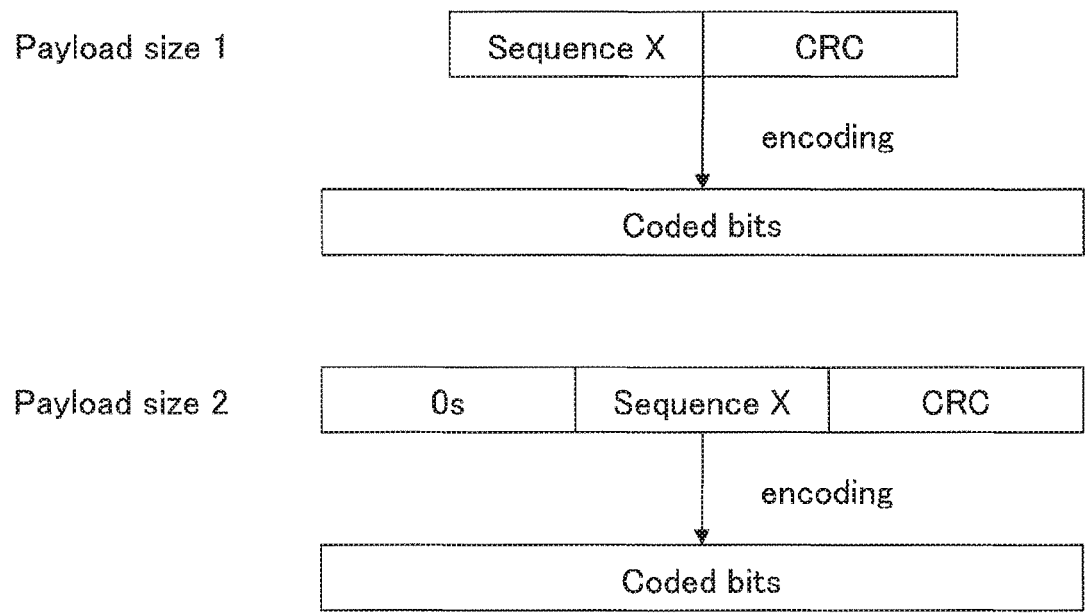
FIG. 19 illustrates an encoding process according to a variant 1.

FIG. 19 illustrates an encoding process according to the variant 1. As illustrated in FIG. 19, there is a case where, although a payload size is changed, bit lengths after encoding are the same.

Although payloads having different payload sizes are input to an encoding unit 111 or 211, the same bit sizes are obtained as Payload size 1 and Payload size 2 illustrated in FIG. 19 in a case of encoding using Polar codes. Because a Polar code can have a configuration such as being nested with another code, the same coded bit lengths may be output even if payloads having different payload sizes are input. Note that a payload that is assumed is, for example, downlink control information and, if the bit length of downlink control information cannot be identified, a problem occurs for obtaining the downlink control information. Therefore, a coded bit length is changed for a different payload size so that the payload size can be identified.

For example, frozen bit values to be used for Polar encoding may be changed on a per payload size basis. For example, all of frozen bits may be made to have values "1"; frozen bits may have such values as "101010" where "10" are repeated a predetermined number of times; and frozen bits may have any previously determined values. Note that a frozen bit length may be determined appropriately.

Figure 20:
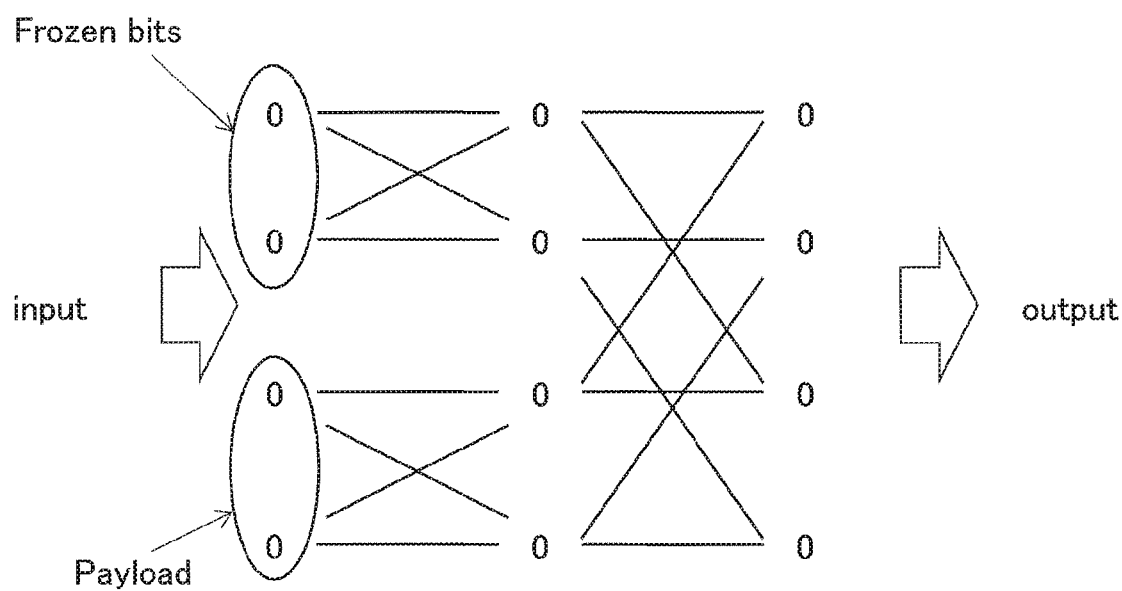
FIG. 20 illustrates an example (1) of an encoding process according to the variant 1.

FIG. 20 illustrates an example (1) of an encoding process according to the variant 1. "Frozen bits" illustrated in FIG. 20 denote frozen bits; "Payload" denotes a payload. By inputting frozen bits having different values in a per payload size basis in an encoding process using a Polar code, it is possible to identify a payload size upon a decoding process of a decoding unit 112 or 212.

It is also possible to change CRC bit values included in a payload, for example. Specifically, a method for generating a CRC may be changed on a per payload size basis. For example, a binary expression of a CRC may be changed; the length of a CRC may be changed through repetitions performed on the basis of a payload size; and a scrambling bit sequence for a CRC may be changed. For example, CRC bits obtained from repetitions performed until a payload size becomes 40 bits may be scrambled with a bit sequence "0101000".

In addition, for example, a CRC may be initialized with additional bits.

FIG. 21 illustrates an example (2) of an encoding process according to the variant 1. As illustrated in FIG. 21, in a normal case where additional bits are not used, a payload includes a "Sequence X" and a "CRC". The "CRC" is generated from the "Sequence X".

In a case of using additional bits, a payload includes "Additional bits", a "Sequence X", and a "CRC". The "CRC" is generated from the "Additional bits" and the "Sequence X". Thereamong, bits to be transmitted include the "Sequence X" and the "CRC" with exclusion of the "Additional bits". In other words, what is Polar encoded is the "Sequence X" and the "CRC". A decoding side performs a decoding process on received "Sequence X" and "CRC" assuming that the "Sequence X" and "CRC" are those encoded with "Additional bits". "Additional bits" may be previously determined on a basis of a payload size. For example, "Additional bits" may be a bit sequence: each bit of the bit sequence is 1 and the bit sequence has a predetermined length. In addition, "Additional bits" may be a bit sequence that is a predetermined nonzero bit sequence and has a predetermined length.

Furthermore, for example, coded bit values may be changed on a per payload size basis. Scrambling is performed on the basis of a payload size or on the basis of a type of a DCI format that is of a payload. For example, it may be previously determined that, in a case of a DCI format 01, scrambling (010101) of repeating "01" is performed.

It is also possible to perform encoding on a per payload size basis by combining a plurality from among a change in frozen bit values, a change in CRC bit values, and a change in coded bit values mentioned above.

As described above, according to the variant 1, by performing, on a per payload size basis, a change in a frozen bit sequence, a change in a CRC bit sequence, or a change in a coded bit sequence, a decoding side can identify a payload size. In other words, in a radio communication system, for a reception side to decode a coded bit sequence, identifying of a payload size can be made easier.

(Apparatus Configuration)

Next, a functional configuration example of the user apparatus 10 and the base station 20 implementing the above-described processing operations will be described.

<User Apparatus>

FIG. 22 illustrates one example of a functional configuration of the user apparatus 10. As illustrated in FIG. 22, the user apparatus 10 includes a signal transmission unit 101, a signal reception unit 102, and a setup information management unit 103. The functional configuration illustrated in FIG. 22 is merely one example. As long as the operations concerning the present embodiment can be implemented, function classifications and names of functional units can be any classifications and names.

The signal transmission unit 101 generates a transmission signal from transmission data and transmits the transmission signal wirelessly. The signal reception unit 102 receives various signals wirelessly and obtains information of a higher layer from a received signal of a physical layer.

The setup information management unit 103 stores various sorts of setup information received from the base station 20 through the signal reception unit 102. The setup information management unit 230 also stores previously set setup information. The contents of the setup information are, for example, one or a plurality of RNTIs, known bit values, and so forth. In addition, the setup information management unit 103 may store an inverse function to be used to calculate values of padding bits.

As illustrated in FIG. 22, the signal transmission unit 101 includes an encoding unit 111 and a transmission unit 121. The encoding unit 111 performs a coding process according to the method 3. For example, the encoding unit 111 is configured to encode (for example, Polar encoding) known bit values, information bit values, and padding bit values, to generate coded information. In addition, the encoding unit 111 has a function to calculate a CRC and includes the CRC in the information bit values. Furthermore, in addition to a coding process according to the method 3, the encoding unit 111 may perform a coding process according to the method 1 and/or a coding process according to the method 2.

The transmission unit 121 is configured to generate a transmission signal from coded information generated by the encoding unit 111 and wirelessly transmit the transmission signal. For example, the transmission unit 121 punctures some of bit values of coded information through rate matching and modulates the punctured coded information to generate modulation symbols (complex-valued modulation symbols). In addition, the transmission unit 121 maps modulation symbols to resource elements, thus generates a transmission signal (for example, an OFDM signal or a SC-FDMA signal), and transmits the transmission signal through an antenna of the transmission unit 121. The transmission signal is received by, for example, another communication apparatus (for example, the base station 20 or the user apparatus 15).

The signal transmission unit 101 of the user apparatus 10 need not have a function to perform Polar encoding.

The signal reception unit 102 includes a decoding unit 112 and a reception unit 122. The reception unit 122 demodulates a signal received from another communication apparatus to obtain likelihoods of the respective bits of coded information obtained from an encoding process (for example, a Polar encoding process). For example, the reception unit 122 performs FFT on a received signal, obtained from a detection process, to obtain signal elements of respective subcarriers, and obtain log-likelihood ratios of respective bits using a QRM-MLD method or the like.

The decoding unit 112, for example, as described above with reference to FIG. 16, uses likelihoods and likelihoods corresponding to a predetermined identifier (for example, a RNTI) to decode coded information. In addition, the decoding unit 112 performs a checking operation using an error detection code (for example, a CRC) on information obtained from coded information through a decoding process, and, if the checking operation is successful, determines that the information is a final decoding result.

<Base Station 20>

Figure 23:
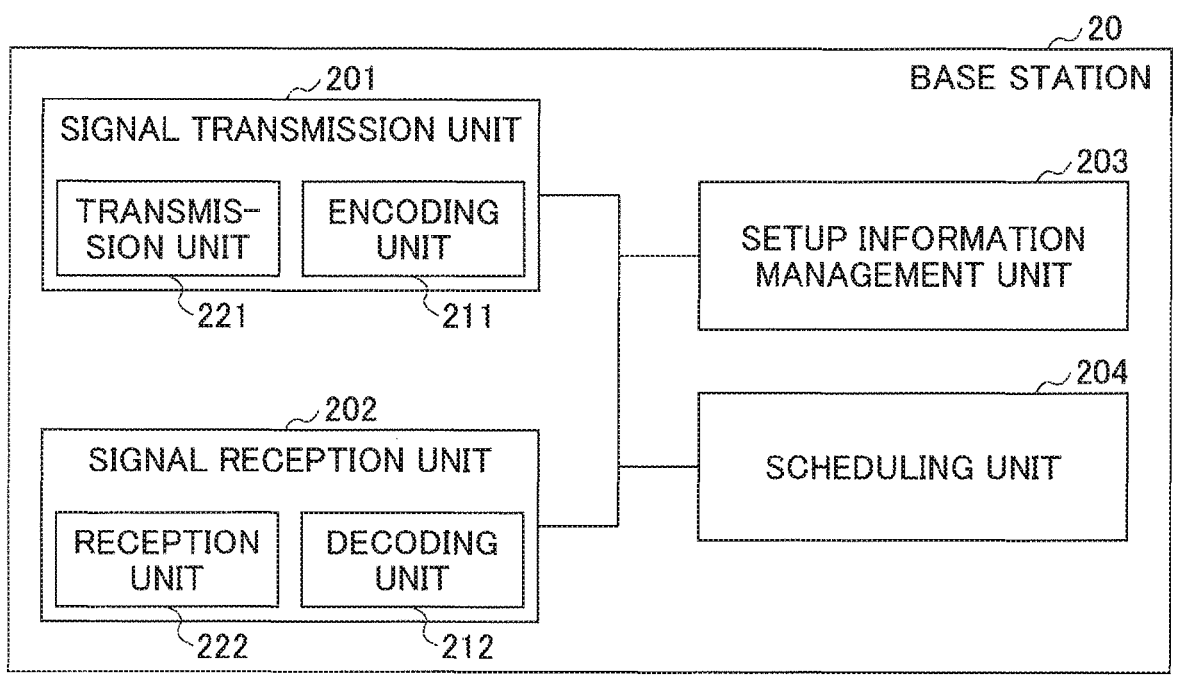
FIG. 23 illustrates one example of a functional configuration of a base station 20.

FIG. 23 illustrates one example of a functional configuration of the base station 20. As illustrated in FIG. 23, the base station 20 includes a signal transmission unit 201, a signal reception unit 202, a setup information management unit 203, and a scheduling unit 204. The functional configuration illustrated in FIG. 23 is merely one example. As long as the operations concerning the present embodiment can be implemented, function classifications and names of functional units can be any classifications and names.

The signal transmission unit 201 has functions to generate a transmission signal to be transmitted to the user apparatus 10 and transmit the transmission signal wirelessly. The signal reception unit 202 has functions to receive various signals transmitted by the user apparatus 10 and obtain information of a higher layer from a received signal of a physical layer, for example.

The setup information management unit 203 stores, for example, known setup information. The contents of the setup information are, for example, one or a plurality of RNTIs and known bit values. In addition, the setup information management unit 203 may store an inverse function to be used to calculate values of padding bits.

The scheduling unit 204, for example, allocates resources that the user apparatus 10 uses (resources for UL communication, resources for DL communication, or resources for SL communication) and sends allocation information to the signal transmission unit 201. The signal transmission unit 201 transmits downlink control information including the allocation information to the user apparatus 10.

As illustrated in FIG. 23, the signal transmission unit 201 includes an encoding unit 211 and a transmission unit 221. The encoding unit 211 performs a coding process according to the method 3. For example, the encoding unit 211 is configured to encode (for example, Polar encoding) known bit values, information bit values, and padding bit values, to generate coded information. In addition, the encoding unit 211 has a function to calculate a CRC and includes the CRC in the information bit values. Furthermore, in addition to a coding process according to the method 3, the encoding unit 211 may perform a coding process according to the method 1 and/or a coding process according to the method 2.

The transmission unit 221 is configured to generate a transmission signal from coded information generated by the encoding unit 211 and wirelessly transmit the transmission signal. For example, the transmission unit 221 punctures some of the bit values of the coded information through rate matching and modulates the punctured coded information to generate modulation symbols (complex-valued modulation symbols). In addition, the transmission unit 221 maps the modulation symbols to resource elements, thus generates a transmission signal (for example, an OFDM signal or a SC-FDMA signal), and transmits the transmission signal through an antenna of the transmission unit 221. The transmission signal is received by, for example, another communication apparatus (for example, the user apparatus 10).

The signal reception unit 202 includes a decoding unit 212 and a reception unit 222. The reception unit 222 demodulates a signal received from another communication apparatus to obtain likelihoods of the respective bits of coded information obtained from an encoding process (for example, a Polar encoding process). For example, the reception unit 222 performs FFT on a received signal, obtained from a detection process, to obtain signal elements of respective subcarriers, and obtain log-likelihood ratios of respective bits using a QRM-MLD method or the like.

The decoding unit 212, for example, as described above with reference to FIG. 16, uses likelihoods and likelihoods corresponding to a predetermined identifier (for example, a RNTI) to decode coded information. In addition, the decoding unit 212 performs a checking operation using an error detection code (for example, a CRC) on information obtained from coded information through a decoding process, and, if the checking operation is successful, determines that the information is a final decoding result.

Note that the signal reception unit 202 of the base station 20 need not have a function to perform Polar decoding.

<Hardware Configurations>

The functional configuration diagrams (FIGS. 22 and 23) used in the description of the above-mentioned embodiment illustrate blocks in function units. These functional blocks (configuration units) are implemented by any combination of hardware and/or software. In this regard, means for implementing the various functional blocks are not limited. That is, each functional block may be implemented by one device that is a physical and/or logical combination of a plurality of elements. In addition, each functional block may be implemented by two or more devices that are physically and/or logically separated and directly and/or indirectly (for example, in a wired and/or wireless manner) connected together.

Figure 24:
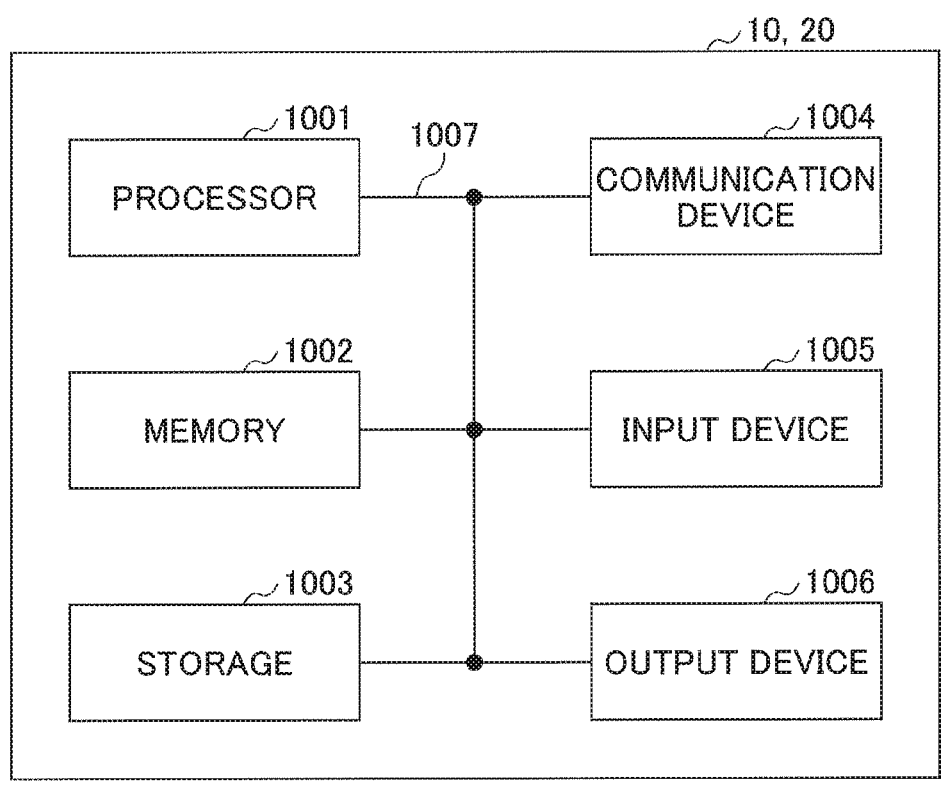
FIG. 24 illustrates hardware configurations of a user apparatus 10 and a base station 20.

Further, for example, each of the user apparatus 10 and the base station 20 according to the embodiment of the present invention may function as a computer that performs processes according to the present embodiment. FIG. 24 illustrates one example of hardware configurations of the user apparatus 10 and the base station 20 according to the present embodiment. Each of the above-described user apparatus 10 and base station 20 may be configured as a computer apparatus that physically includes a processor 1001, a memory 1002, a storage 1003, a communication device 1004, an input device 1005, an output device 1006, a bus 1007, and so forth.

Note that, below, the term "device" may be read as a circuit, a unit, or the like. The hardware configurations of the user apparatus 10 and the base station 20 may include one or more of each of the devices 1001-1006 illustrated, and may be configured not to include some of the devices 1001-1006 illustrated.

Each of the functions of the user apparatus 10 and the base station 20 is implemented as a result of hardware such as the processor 1001 and the memory 1002 reading predetermined software (program) and thereby the processor 1001 performing operations to control communication by the communication device 1004 and control reading data from and/or writing data to the memory 1002 and the storage 1003.

The processor 1001 controls the entirety of the computer by causing an operating system to operate, for example. The processor 1001 may include a central processing unit (CPU)

that includes an interface for a peripheral device, a control device, an arithmetic device, a register, and so forth.

The processor 1001 reads a program (a program code), a software module, or data from the storage 1003 and/or the communication device 1004 onto the memory 1002, and thus implements various processes according to the read information. As the program, a program that causes the computer to perform at least some of the operations described above for the above-mentioned embodiment is used. For example, the signal transmission unit 101, the signal reception unit 102, and the setup information management unit 103 of the user apparatus 10 illustrated in FIG. 22 may be implemented by a control program that is stored in the memory 1002 and operates with the processor 1001. Further, for example, the signal transmission unit 201, the signal reception unit 202, the setup information management unit 203, and the scheduling unit 204 of the base station 20 illustrated in FIG. 23 may be implemented by a control program that is stored in the memory 1002 and operates with the processor 1001. In this regard, it has been described that various processes described above are implemented by the single processor 1001. However, the various processes may be implemented by two or more processors 1001 simultaneously or sequentially. The processor 1001 may be implemented by one or more chips. Note that the program may be transmitted from a network through an electric communication line.

The memory 1002 is a computer readable recording medium and may include, for example, at least one of a ROM (Read-Only Memory), an EPROM (Erasable Programmable ROM), an EEPROM (Electrically Erasable Programmable ROM), a RAM (Random Access Memory), and so forth. The memory 1002 may be called a register, a cache, a main memory (a main storage), or the like. The memory 1002 can store a program (program codes), a software module, or the like executable for implementing processes according to the embodiment of the present invention.

The storage 1003 is a computer readable recording medium and may include, for example, at least one of an optical disc such as a CD-ROM (Compact Disc ROM), a hard disk drive, a flexible disk, a magneto-optical disc (for example, a compact disc, a digital versatile disc, or a Blu-ray (registered trademark) disc), a smart card, a flash memory (for example, a card, a stick, or a key drive), a floppy (registered trademark) disk, a magnetic strip, and so forth. The storage 1003 may be called an auxiliary storage device. The above-described recording medium may be, for example, a suitable medium such as a database, a server, or the like that includes the memory 1002 and/or the storage 1003.

The communication device 1004 is hardware (a transmission and reception device) for performing communication between computers through a wired and/or wireless network and may also be called, for example, a network device, a network controller, a network card, a communication module, or the like. For example, the signal transmission unit 101 and the signal reception unit 102 of the user apparatus 10 may be implemented by the communication device 1004. Further, the signal transmission unit 201 and the signal reception unit 202 of the base station 20 may be implemented by the communication device 1004.

The input device 1005 is an input device (for example, a keyboard, a mouse, a microphone, a switch, a button, a sensor, or the like) that receives an input from the outside. The output device 1006 is an output device (for example, a display, a speaker, a LED light, or the like) that performs outputting to the outside. The input device 1005 and the output device 1006 may have an integrated configuration (for example, a touch panel).

Further, various devices such as the processor 1001 and the memory 1002 are connected together via the bus 1007 for performing communication of information. The bus 1007 may be configured by a single bus and may be configured by different buses corresponding to the various devices.

Further, each of the user apparatus 10 and the base station 20 may include hardware such as a microprocessor, a digital signal processor (DSP), an ASIC (Application Specific Integrated Circuit), a PLD (Programmable Logic Device), or a FPGA (Field Programmable Gate Array). The hardware may implement some or all of the various functional blocks. For example, the processor 1001 may be implemented by at least one of these types of hardware.

Summary of Embodiment

As described above, according to the present embodiment, a communication apparatus includes an encoding unit configured to generate a second coded bit sequence by encoding according to a second encoding scheme a frozen bit sequence and a second bit sequence that includes a first bit sequence and a first coded bit sequence generated from encoding the first bit sequence according to a first encoding scheme; and a transmission unit configured to transmit a transmission signal generated from the second coded bit sequence. The communication apparatus determines the second coded bit sequence on the basis of a length of the second bit sequence.

Thanks to the configuration, as a result of, on a basis of the payload size, a change in a frozen bit sequence, a change in a CRC bit sequence, or a change in a coded bit sequence being performed, a decoding side can identify a payload size. In other words, in a radio communication system, upon decoding of a coded bit sequence by a reception side, it is possible to easily identify a payload length.

The frozen bit sequence may be determined on the basis of the length of the second bit sequence. Thus, a frozen bit sequence can be changed on the basis of a payload size.

A bit sequence to be used to scramble the first coded bit sequence may be determined on the basis of the length of the second bit sequence. Thus, scrambling of a CRC bit sequence can be changed on the basis of a payload size.

The first coded bit sequence may be generated from encoding an additional bit sequence and the first bit sequence according to the first encoding scheme. Thus, a CRC bit sequence generating method can be changed on the basis of the additional bits.

The additional bit sequence may be a bit sequence: each bit of the bit sequence is 1 or the bit sequence is a predetermined nonzero bit sequence; and the bit sequence has a predetermined length. Thus, additional bits can be changed on the basis of a payload size.

A bit sequence to be used to scramble the second coded bit sequence may be changed on the basis of the length of the second bit sequence. Thus, scrambling of a Polar encoded bit sequence can be changed on the basis of a payload size.

As described above, according to the present embodiment, a communication apparatus used in a radio communication system includes an encoding unit configured to generate a second bit sequence by encoding according to a second encoding scheme an input frozen bit sequence and a payload bit sequence that includes an information bit sequence and a first coded bit sequence generated from encoding the information bit sequence according to a first encoding scheme; and a transmission unit configured to generate a transmission signal generated from the second coded bit sequence generated by the encoding unit and transmit the transmission signal. The communication apparatus makes different the generated second coded bit sequence on the basis of a length of the payload bit sequence.

Thanks to the configuration, as a result of, on a basis of the payload size, a change in a frozen bit sequence, a change in a CRC bit sequence, or a change in a coded bit sequence being performed, a decoding side can identify a payload size. In other words, in a radio communication system, upon decoding of a coded bit sequence by a reception side, it is possible to easily identify a payload length.

The frozen bit sequence may be changed on the basis of the length of the payload bit sequence. Thus, a frozen bit sequence can be changed on the basis of a payload size.

A bit sequence to be used to scramble the first coded bit sequence may be determined on the basis of the length of the payload bit sequence. Thus, scrambling of a CRC bit sequence can be changed on the basis of a payload size.

An additional bit sequence may be determined on the basis of the length of the payload bit sequence and the coded bit sequence obtained according to the first encoding scheme may be generated from encoding the additional bit sequence and the information bit sequence according to the first encoding scheme. Thus, a CRC bit sequence generating method can be changed on the basis of the payload size.

The additional bit sequence may be a bit sequence: each bit of the bit sequence is 1 or the bit sequence is a predetermined nonzero bit sequence; and the bit sequence has a predetermined length. Thus, additional bits can be changed on the basis of a payload size.

A bit sequence to be used to scramble the second coded bit sequence may be changed on the basis of the length of the payload bit sequence. Thus, scrambling of a Polar encoded bit sequence can be changed on the basis of a payload size.

As described above, according to the present embodiment, a communication apparatus used in a radio communication system includes an encoding unit configured to generate coded information by performing predetermined encoding on input known bit values, information bit values, and padding bit values; and a transmission unit configured to generate a transmission signal from the coded information generated by the encoding unit and transmit the transmission signal. The padding bit values are values to be converted to a predetermined identifier through the above-mentioned coding. The predetermined identifier is used by another communication that receives the transmission signal to decode the coded information.

Thanks to the configuration, a technology is provided, according to which, in a radio communication system where a transmission side transmits coded information to which a predetermined identifier is applied and a reception side uses the predetermined identifier to detect the information, the reception side can have a satisfactory false detection rate.

The transmission unit may puncture from the coded information the predetermined identifier obtained from the above-mentioned coding. Thereby, it is possible to reduce the number of bits of the transmission signal.

Furthermore, according to the present embodiment, a communication apparatus used in a radio communication system includes a reception unit configured to demodulate a signal received from another communication apparatus to obtain likelihoods of respective bits of coded information coded according to predetermined coding; and a decoding unit configured to use the likelihoods and likelihoods corresponding to a predetermined identifier to decode the coded information.

Thanks to the configuration, a technology is provided, according to which, in a radio communication system where a transmission side transmits coded information to which a predetermined identifier is applied and a reception side uses the predetermined identifier to detect information, the reception side can have a satisfactory false detection rate.

The decoding unit uses, as known bit values used for the decoding, frozen bit values and known padding bit values, for example. Thereby, it is possible to properly implement decoding that uses known information (for example, Polar decoding).

The decoding unit may perform a check using an error detection code on information obtained from decoding the coded information and, in response to the check being successful, may determine that the information is a final decoding result. Thereby, it is possible to properly determine correctness of received information.

Supplement to Embodiment

Thus, the embodiment of the present invention has been described. However, the disclosed invention is not limited to such an embodiment of the present invention, and the person skilled in the art will understand various variants, modifications, alternatives, replacements, and so forth. Although specific numerical values have been used as examples for promoting understanding of the invention, the numerical values are merely examples unless otherwise noted, and any other suitable values may be used instead. Classifications of items in the above description are not essential to the present invention, contents described in two or more items may be used in combination if necessary, and contents described in an item may be applied to contents described in another item (unless a contradiction arises). The boundaries between the functional units or the processing units in the functional block diagrams do not necessarily correspond to the boundaries of physical components. Operations of a plurality of functional units may be physically implemented by a single component and an operation of a single functional unit may be physically implemented by a plurality of components. Concerning the operation procedures described above for the embodiment of the present invention, the orders of steps may be changed unless a contradiction arises. For the sake of convenience for describing the operations, the user apparatus 10 and the base station 20 have been described with the use of the functional block diagrams. These apparatuses may be implemented by hardware, software, or a combination thereof. Each of software functioning with a processor of the user apparatus 10 according to the embodiment of the present invention and software functioning with a processor of the base station 20 according to the embodiment of the present invention may be stored in any suitable recording medium such as a random access memory (RAM), a flash memory, a read-only memory (ROM), an EPROM, an EEPROM, a register, a hard disk (HDD), a removable disk, a CD-ROM, a database, or a server.

Providing of information may be implemented not only according to the embodiment of the present invention described herein but also by another method. For example, providing of information may be implemented with the use of physical layer signaling (for example, DCI (Downlink Control Information) or UCI (Uplink Control Information)), higher layer signaling (for example, RRC (Radio Resource Control) signaling, MAC (Medium Access Control) signaling, broadcast information (a MIB (Master Information Block), or a SIB (System Information Block)), or another signal, or a combination thereof. Further, RRC signaling may be called a RRC message, and, for example, may be a RRC Connection Setup message, a RRC Connection Reconfiguration message, or the like.

Each embodiment of the present invention described herein may be applied to a system that uses a suitable system such as LTE (Long Term Evolution), LTE-A (LTE-Advanced), SUPER 3G, IMT-Advanced, 4G, 5G, FRA (Future Radio Access), W-CDMA (registered trademark), GSM (registered trademark), CDMA2000, UMB (Ultra Mobile Broadband), IEEE 802.11 (Wi-Fi), IEEE 802.16 (WiMAX), IEEE 802.20, UWB (Ultra-WideBand), or Bluetooth (registered trademark); and/or a next-generation system expanded on the basis thereof.

Concerning the operation procedures, sequences, flowcharts, and so forth according to each embodiment described herein, the orders of steps may be changed unless a contradiction arises. For example, concerning the methods described herein, the various step elements are illustrated in the exemplary orders and are not limited to the illustrated specific orders.

The specific operations performed by the base station 20 described herein may in some cases be performed by an upper node. It is clear that the various operations performed for communication with the user apparatus 10 can be performed by the base station 20 and/or another network node (for example, a MME, a S-GW or the like may be cited, but not limited thereto) in a network that includes one or more network nodes including the base station 20. In the above, the description has been made for the case where the another network node other than the base station 20 is a single node as an example. In this regard, the another network node may be a combination of a plurality of other network nodes (for example, a MME and a S-GW).

Each embodiment described herein may be solely used, may be used in combination with another embodiment, and may be used in a manner of being switched with another embodiment upon implementation.

By the person skilled in the art, the user apparatus 10 may be called any one of a subscriber station, a mobile unit, a subscriber unit, a wireless unit, a remote unit, a mobile device, a wireless device, a wireless communication device, a remote device, a mobile subscriber station, an access terminal, a mobile terminal, a wireless terminal, a remote terminal, a handset, a user agent, a mobile client, a client, and other suitable terms.

By the person skilled in the art, the base station 20 may be called any one of a NB (NodeB), an eNB (evolved NodeB), a gNB, a base station, and other suitable terms.

The term "to determine" used herein may mean various operations. For example, "to determine" may mean to consider having "determined" to have performed judging, calculating, computing, processing, deriving, investigating, looking up (for example, looking up a table, a database, or another data structure), or ascertaining, or the like. Also, "to determine" may mean to consider having "determined" to have performed receiving (for example, receiving information), transmitting (for example, transmitting information), inputting, outputting, or accessing (for example, accessing data in a memory), or the like. Also, "to determine" may mean to consider having "determined" to have performed resolving, selecting, choosing, establishing, comparing, or the like. That is, "to determine" may mean to consider having "determined" a certain operation.

Words "based on" or "on the basis of" used herein do not mean "based on only" or "on the basis of only" unless otherwise specified. That is, the words "based on" or "on the basis of" mean both "based on only" and "based on at least" or both "on the basis of only" and "on the basis of at least".

As long as any one of "include", "including", and variations thereof is used herein or used in the claims, this term has an intended meaning of inclusiveness in the same way as the term "comprising". Further, the term "or" used herein or used in the claims has an intended meaning of not exclusive-or.

Throughout the present disclosure, in a case where an article such as a, an, or the in English is added through a translation, the article may be of a plural form unless the context clearly indicates otherwise.

Note that, in the embodiment of the present invention, an encoding scheme using a CRC is one example of a first encoding scheme. Polar codes, LDPC codes and convolution codes are examples of a second encoding scheme. Additional bits are example of an additional bit sequence.

Thus, the present invention has been described in detail. In this regard, it is clear for the person skilled in the art to understand that the present invention is not limited to the embodiment of the present invention described herein. The present invention can be implemented in a modified or changed mode without departing from the spirit and the scope of the present invention determined by the descriptions of the claims. Therefore, the description herein is for an illustrative purpose and does not have any restrictive meaning for the present invention.

The present international patent application is based on and claims priority to Japanese patent application No. 2017-229496 filed Nov. 29, 2017; the contents of Japanese patent application No. 2017-229496 are incorporated herein by reference in their entirety.

DESCRIPTION OF REFERENCE SIGNS

10, 15 user apparatuses
101 signal transmission unit
102 signal reception unit
103 setup information management unit
20 base station
201 signal transmission unit
202 signal reception unit
203 setup information management unit
204 scheduling unit
1001 processor
1002 memory
1003 storage
1004 communication device
1005 input device
1006 output device

The invention claimed is:
1. A communication apparatus comprising:
a processor that generates a first encoded bit sequence by, according to a first encoding procedure, encoding an additional bit sequence and a first sequence of bits, the additional bit sequence being comprised of all one bits and having a predetermined length, and generates a second encoded bit sequence by, according to a second encoding procedure, encoding:
a known bit sequence comprising at least one frozen bit with a value of zero; and
a second sequence of bits comprising the first sequence of bits and the first encoded bit sequence; and a transmitter that transmits a signal generated from the second encoded bit sequence, wherein the second encoded bit sequence is determined based on a length of the second sequence of bits and a matrix, wherein the length of the known bit sequence is based on a difference between a length of the second encoded bit sequence and the length of the second sequence of bits, and wherein the first encoding procedure changes based on a size of a payload.

2. The communication apparatus as claimed in claim 1, wherein the known bit sequence is determined based on a length of the second sequence of bits.

3. The communication apparatus as claimed in claim 1, wherein the additional bit sequence is added to the first sequence of bits before the first encoded bit sequence is generated by the encoding according to the first encoding procedure.

4. A wireless communication system comprising:
the communication apparatus as claimed in claim 1; and
a second communication apparatus comprising:
a receiver that receives the signal generated from the second encoded bit sequence.

5. A communication method comprising:
generating a first encoded bit sequence by, according to a first encoding procedure, encoding an additional bit sequence and a first sequence of bits, the additional bit sequence being comprised of all one bits and having a predetermined length, and generating a second encoded bit sequence by, according to a second encoding procedure, encoding:
a known bit sequence comprising at least one frozen bit with a value of zero; and
a second sequence of bits comprising the first sequence of bits and the first encoded bit sequence; and transmitting a signal generated from the second encoded bit sequence, wherein the second encoded bit sequence is determined based on a length of the second sequence of bits and a matrix, wherein the length of the known bit sequence is based on a difference between a length of the second encoded bit sequence and the length of the second sequence of bits, and wherein the first encoding procedure changes based on a size of a payload.

* * * * *